US006861330B2

(12) United States Patent
Basceri et al.

(10) Patent No.: US 6,861,330 B2
(45) Date of Patent: Mar. 1, 2005

(54) STRUCTURES AND METHODS FOR ENHANCING CAPACITORS IN INTEGRATED CIRCUITS

(75) Inventors: Cem Basceri, Boise, ID (US); Gurtej Singh Sandhu, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/232,217

(22) Filed: Aug. 29, 2002

(65) Prior Publication Data

US 2003/0001187 A1 Jan. 2, 2003

Related U.S. Application Data

(62) Division of application No. 09/533,433, filed on Mar. 23, 2000, now Pat. No. 6,476,432.

(51) Int. Cl.[7] ................................................ H01L 21/20

(52) U.S. Cl. ....................... 438/387; 438/396; 257/303; 257/306

(58) Field of Search ................................ 438/244, 253, 438/256, 387, 396, 696, 700, 702, 703, 763; 257/301, 303, 304, 306

(56) References Cited

U.S. PATENT DOCUMENTS

| | | | | |
|---|---|---|---|---|
| 5,043,780 A | | 8/1991 | Fazan et al. | 357/23.6 |
| 5,138,411 A | | 8/1992 | Sandhu | 357/23.6 |
| 5,196,360 A | | 3/1993 | Doan et al. | 437/41 |
| 5,208,176 A | | 5/1993 | Ahmad et al. | 437/47 |
| 5,258,637 A | | 11/1993 | Sandhu et al. | 257/384 |
| 5,304,506 A | | 4/1994 | Porter et al. | 437/60 |
| 5,335,138 A | | 8/1994 | Sandhu et al. | 361/303 |
| 5,340,765 A | | 8/1994 | Dennison et al. | 437/52 |
| 5,381,302 A | | 1/1995 | Sandhu et al. | 361/305 |
| 5,392,189 A | | 2/1995 | Fazan et al. | 361/305 |
| 5,506,166 A | | 4/1996 | Sandhu et al. | 437/60 |
| 5,521,111 A | * | 5/1996 | Sato | 438/244 |
| 5,654,222 A | | 8/1997 | Sandhu et al. | 438/3 |
| 5,663,088 A | | 9/1997 | Sandhu et al. | 438/396 |
| 5,665,625 A | | 9/1997 | Sandhu et al. | 438/396 |
| 5,686,748 A | | 11/1997 | Thakur et al. | 257/310 |
| 5,691,009 A | | 11/1997 | Sandhu | 427/534 |
| 5,706,164 A | * | 1/1998 | Jeng | 361/324.4 |
| 5,731,235 A | | 3/1998 | Srinivasan et al. | 438/396 |
| 5,741,546 A | | 4/1998 | Sandhu | 427/255.1 |
| RE35,785 E | | 5/1998 | Sandhu et al. | 438/681 |
| 5,801,104 A | | 9/1998 | Schuegraf et al. | 438/778 |
| 5,812,360 A | | 9/1998 | Sandhu et al. | 361/321.4 |
| 5,814,852 A | | 9/1998 | Sandhu et al. | 257/310 |
| 5,824,365 A | | 10/1998 | Sandhu et al. | 427/239 |
| 5,854,734 A | | 12/1998 | Sandhu et al. | 361/321.5 |

(List continued on next page.)

*Primary Examiner*—Jerome Jackson
*Assistant Examiner*—José R. Diaz
(74) *Attorney, Agent, or Firm*—Schwegman, Lundberg, Woessner & Kluth, P.A.

(57) ABSTRACT

Systems, devices, structures, and methods are described that inhibit dielectric degradation in the presence of contaminants. An enhanced capacitor in a dynamic random access memory cell is discussed. The enhanced capacitor includes a first electrode, a dielectric coupled to the first electrode, a second electrode coupled to the dielectric, and at least one inhibiting layer that couples to the first electrode, the dielectric, and the second electrode. The inhibiting layer defines a chamber that encloses the capacitor and renders the capacitor impervious to disturbance in its physical or chemical forces in the presence of contaminants. The inhibiting layer includes a nitride compound, an oxynitride compound, and an oxide compound. In one embodiment, the nitride compound includes $Si_xN_y$. In another embodiment, the oxynitride compound includes $SiO_xN_y$. In another embodiment, the oxide compound includes $Al_2O_3$ and $(SrRu)O_3$. The variables x and y are indicative of a desired number of atoms. The dielectric includes an oxide compound. In one embodiment, the oxide compound includes barium strontium titanate.

30 Claims, 16 Drawing Sheets

U.S. PATENT DOCUMENTS

| | | | | | |
|---|---|---|---|---|---|
| RE36,050 | E | | 1/1999 | Thakur et al. | 374/161 |
| 5,882,978 | A | | 3/1999 | Srinivasan et al. | 438/396 |
| 5,920,763 | A | | 7/1999 | Schuegraf | 438/3 |
| 5,952,687 | A | * | 9/1999 | Kawakubo et al. | 257/296 |
| 5,955,758 | A | | 9/1999 | Sandhu et al. | 257/306 |
| 5,959,327 | A | | 9/1999 | Sandhu et al. | 257/310 |
| 5,976,928 | A | * | 11/1999 | Kirlin et al. | 438/240 |
| 5,977,581 | A | | 11/1999 | Thakur et al. | 257/310 |
| 5,985,732 | A | | 11/1999 | Fazan et al. | 438/398 |
| 5,997,634 | A | | 12/1999 | Sandhu et al. | |
| 6,001,675 | A | | 12/1999 | Sandhu et al. | 438/151 |
| 6,008,086 | A | | 12/1999 | Schuegraf et al. | 438/255 |
| 6,054,191 | A | | 4/2000 | Sharan et al. | 427/534 |
| 6,066,528 | A | | 5/2000 | Fazan et al. | 438/253 |
| 6,077,754 | A | | 6/2000 | Srinivasan et al. | 438/396 |
| 6,083,568 | A | | 7/2000 | Sandhu | 427/534 |
| 6,084,302 | A | | 7/2000 | Sandhu | 257/751 |
| 6,090,670 | A | | 7/2000 | Sandhu et al. | 438/286 |
| 6,103,570 | A | | 8/2000 | Sandhu et al. | 438/255 |
| 6,124,626 | A | | 9/2000 | Sandhu et al. | 257/532 |
| 6,242,299 | B1 | * | 6/2001 | Hickert | 438/240 |
| 6,246,082 | B1 | | 6/2001 | Mitarai et al. | 257/295 |
| 6,249,014 | B1 | | 6/2001 | Bailey | 257/295 |
| 6,613,586 | B2 | * | 9/2003 | Bailey | 438/3 |

* cited by examiner 900
902
910
912
920
930
940

STRUCTURES AND METHODS FOR ENHANCING CAPACITORS IN INTEGRATED CIRCUITS

RELATED APPLICATION

This application is a divisional under 37 CFR 1.53(b) of U.S. application Ser. No. 09/533,433, filed Mar. 23, 2000 now U.S. Pat. No. 6,476,432, which application is incorporated herein by reference.

TECHNICAL FIELD

The technical field relates generally to semiconductor integrated circuits. More particularly, it pertains to capacitors in semiconductor integrated circuits.

BACKGROUND

A capacitor is composed of two layers of a material that is electrically conductive (hereinafter, electrode) brought near to one another and separated by a material that is electrically nonconductive. Suppose the capacitor is connected to a battery with a certain voltage level (hereinafter, energy level). Charges will flow from the battery to be stored in the capacitor until the capacitor exhibits the energy level of the battery. Then, suppose further that the capacitor is disconnected from the battery. The capacitor will indefinitely exhibit the energy level of the battery until the charges stored in the capacitor are removed either by design or by accident.

This ability of the capacitor to "remember" an energy level is valuable to the operation of semiconductor integrated circuits. Often, the operation of such circuits may require that data be stored and retrieved as desired. Because of its ability to remember, the capacitor is a major component of a semiconductor memory cell. One memory cell may store one bit of data. A system of memory cells is a semiconductor memory array where information can be randomly stored or retrieved from each memory cell. Such a system is also known as a random-access memory.

One type of random-access memory is dynamic random-access memory (DRAM). The charges stored in DRAM tend to leak away over a short time. It is thus necessary to periodically refresh the charges stored in the DRAM by the use of additional circuitry. Even with the refresh burden, DRAM is a popular type of memory because it can occupy a very small space on a semiconductor surface. This is desirable because of the need to maximize storage capacity on the limited surface area of an integrated circuit One type of capacitor that supports an increase in storage capacity uses an electrically nonconductive material that has a high dielectric constant. The processing of such a capacitor occurs in an environment that may not be completely contaminant-proof. Such contaminants may act to degrade the electrically nonconductive material. That act compromises the ability of the capacitor to maintain the charges. This is detrimental to the storage ability of a capacitor and would render a memory cell defective.

Thus, what is needed are systems, devices, structures, and methods to inhibit the described effect so as to enhance capacitors with a high dielectric constant in the presence of contaminants.

SUMMARY

The above-mentioned problems with capacitors as well as other problems are addressed by the present invention and will be understood by reading and studying the following specification. Systems, devices, structures, and methods are described which accord these benefits.

An illustrative embodiment includes a capacitor in a dynamic random access memory cell. The capacitor includes a first electrode, a dielectric coupled to the first electrode, and a second electrode coupled to the dielectric. The dielectric includes a thin film dielectric. The thin film dielectric includes an oxide compound. The oxide compound includes barium strontium titanate. The capacitor also includes at least one inhibiting layer that couples to the first electrode, the dielectric, and to the second electrode to define a chamber. The inhibiting layer includes a nitride compound. The nitride compound includes $Si_xN_y$. The variables x and y are indicative of a desired number of atoms.

Another illustrative embodiment includes a method of enhancing a semiconductor structure so as to inhibit dielectric degradation. The method includes forming at least one inhibiting layer to define a chamber having an aperture and at least two sidewalls that extend outwardly from the aperture. The inhibiting layer includes a nitride compound. The method includes forming a first conductive layer on the inhibiting layer such that the aperture of the chamber of the inhibiting layer exposes a portion of the first conductive layer. The method includes forming a dielectric layer on the first conductive layer. The dielectric layer includes an oxide compound. The oxide compound includes barium strontium titanate. The method includes annealing the semiconductor structure at a temperature of about greater than or about equal to 100 degrees Celsius. The act of annealing may occur in an ambient selected from a group consisting of $N_2$, Ar, He, $O_2$, $O_3$, NO, and $N_2O$. The method includes iterating the act of annealing after forming the first conductive layer, after forming a dielectric layer, and after forming the second conductive layer.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
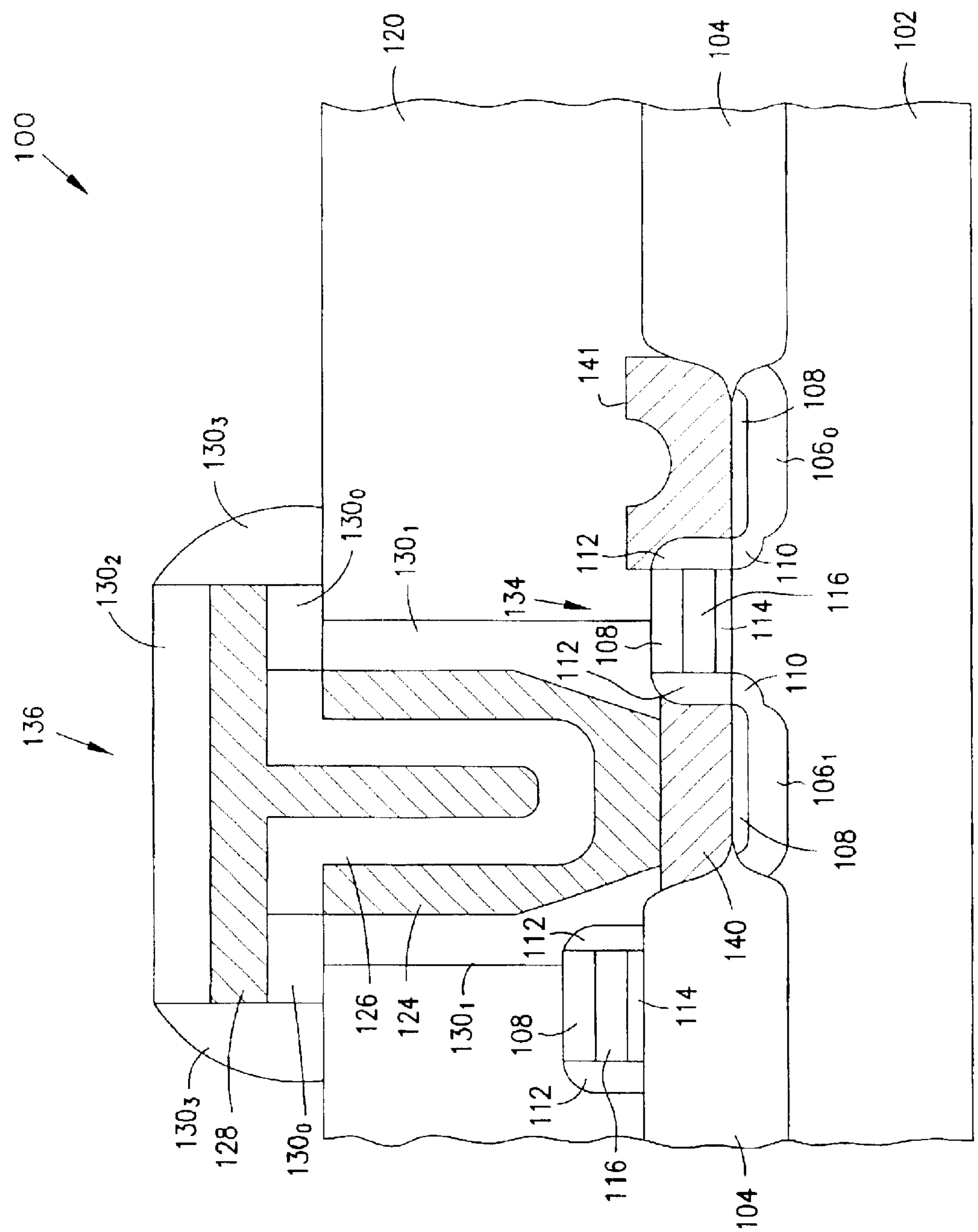
FIG. 1 is a cross-sectional view of a semiconductor structure according to one embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and any layer that may have been formed above. The following detailed description is, therefore, not to be taken in a limiting sense, and the scope of the present invention is defined only by the appended claims.

FIG. 1 is a cross-sectional view of a semiconductor structure according to one embodiment of the present invention. The semiconductor structure 100 may illustrate an example of a single DRAM cell. The semiconductor structure 100 includes a substrate 102, field isolators 104, transistor 134, insulation layers 120, another semiconductor structure such as a capacitor 136, and a metallization layer 140. In one embodiment, the metallization layer 140 may be considered a conductive plug. In another embodiment, the conductive plug includes polysilicon. The transistor 134 includes source/drain regions $\mathbf{106}_0$ and $\mathbf{106}_1$, silicide region 108, spacers 112, gate oxide 114, and gate 116. The source/drain regions $\mathbf{106}_0$ and $\mathbf{106}_1$ include lightly doped source/drain regions 110. The capacitor 136 includes an electrode 124, a dielectric layer 126, another electrode 128, and at least one inhibiting layer that comprises $\mathbf{130}_0$, $\mathbf{130}_1$, $\mathbf{130}_2$, and $\mathbf{130}_3$. The dielectric layer 126 is coupled to the electrodes 124 and 128. In various embodiments, the dielectric 126 includes $(Ba,Sr)TiO_3$, $SrTiO_3$, $BaTiO_3$, $Pb(Zr,Ti)O_3$, $(Pb,La)(Zr,Ti)O_3$, $SrBi_2Ta_2O_9$, $SrBi_2Nb_2O_9$, $SrBi_2(Nb\ Ta)_2O_9$, $Ta_2O_5$, doped $Ta_2O_5$, Ti-doped $Ta_2O_5$, $Al_2O_3$, $ZrO_2$, $HfO_2$, $SiO_xN_y$.

Charges can be transferred into or removed from the capacitor 136 by turning on the transistor 134. The transistor 134 is turned on by an appropriate voltage level and polarity placed at the gate 116 so that a depletion region and conducting channel are formed between the source/drain regions $\mathbf{106}_0$ and $\mathbf{106}_1$. If charges are to be transferred into the capacitor 136, these charges are introduced at the source/drain region $\mathbf{106}_0$ by a buried bit line 141, so that they may travel across the conducting channel into the source/drain region $\mathbf{106}_1$, conduct through the metallization layer 140, and enter the electrode 124. The charges cannot go any further because the dielectric layer 126 is electrically nonconductive. However, these charges will attract opposite polarity charges to appear at electrode 128. Hence, an electric field is set up between the electrodes 124 and 128. Energy is stored in this electric field. This electric field is the phenomenon that allows the capacitor to "remember."

There exists an industry-wide drive to smaller memory cells to increase storage density on the limited surface area of an integrated circuit. This has motivated the use of a thin film nonconductive material for use as a dielectric 126 of the capacitor 136. Contaminants may be present in the processing of the semiconductor structure 100. Such contaminants include moisture and diatomic substances, such as hydrogen ($H_2$) or $N_2$—$H_2$. Moisture may come from the de-ionized water that is used to rinse and clean the semiconductor structure 100. Diatomic substances exists in a gaseous form during an annealing process. In one embodiment, such a gaseous form occurs at about 400 degrees Celsius. Without at least one of the inhibiting layers $\mathbf{130}_0$, $\mathbf{130}_1$, $\mathbf{130}_2$, and $\mathbf{130}_3$, the contaminants may undesirably act with a portion of the semiconductor structure 100, such as the dielectric 126 of the capacitor 136. Such act may degrade the properties of the dielectric 126 to cause the capacitor 136 to become defective over time.

At least four types of dielectric property are affected by the presence of contaminants. First, dielectric loss may undesirably have a dependent relationship with the operating frequency of the system in the presence of contaminants. Such a dependent relationship may be caused by the dispersion of the permittivity. Thus, as the frequency of the system is increased, the dielectric loss is increased thereby causing the capacitor 136 to become defective. This degradation is especially pernicious since there is a need to move data at a speed in the gigahertz range. At this speed, with this degradation, the capacitor loses its valuable ability to remember.

A second type of dielectric property that is degraded in the presence of contaminants includes a decrease in the permittivity. A capacitor with a small permittivity does not store as many charges. This degradation defeats the ability of reducing the sizes of capacitor while increasing the ability of the capacitor to store more charges.

Third, contaminants may cause the dielectric to leak stored charges and thereby cause a loss of stored data.

And fourth, a decrease in dielectric lifetime is seen in the presence of contaminants. Contaminants have a significant impact on the dielectric lifetime compared to other properties of the dielectric. In many instances, the lifetime of the dielectric is decreased by several orders of magnitude. Additionally, the lifetime of the dielectric may be decreased while no apparent degradation can be observed with other properties of the dielectric. In one experiment, a constant voltage is applied to a semiconductor structure that includes a dielectric material in the presence of contaminants. Over time, leakage of charges is increased at that constant voltage.

A formation of a hydroxide compound due to moisture may be a cause of the degradation. Another cause of the degradation due to hydrogen may be attributed by a formation of shallow donor levels in the dielectric material, or from changes in the stoichiometry of the dielectric and in the dielectric's surrounding films (such as the electrodes). For films containing oxygen, change in stoichiometry generally occurs by reduction of oxygen content in those films by hydrogen.

Thus, in the case in which the dielectric 126 includes barium strontium titanate, some of the hydroxide compound includes barium hydroxide, barium hydroxide complex (such as barium-strontium-titanium hydroxide), strontium hydroxide, and titanium hydroxide. In other cases, the hydroxide compound may be a complex hydroxide compound.

Returning to FIG. 1, at about room temperature or greater, contaminants within the vicinity of the semiconductor 100 may form a hydroxide compound in various places, such as on the electrode 124, in the dielectric 126, on the electrode 128, or on the interfaces of the dielectric 126 and the electrodes 124 and 128. Such a formation of a hydroxide compound or other undesired substances and compounds compromises the reliability of the dielectric 126.

At least one of the inhibiting layers $\mathbf{130_0}$, $\mathbf{130_1}$, $\mathbf{130_2}$, and $\mathbf{130_3}$ acts to inhibit such compromise from occurring. In one embodiment, at least one of the inhibiting layers $\mathbf{130_0}$, $\mathbf{130_1}$, $\mathbf{130_2}$, and $\mathbf{130_3}$ acts to inhibit degradation to a semiconductor portion of interest in the presence of contaminants; such a semiconductor portion of interest may include electrodes 124 and 128 as well as the dielectric 126. In one embodiment, at least one of the inhibiting layers $\mathbf{130_0}$, $\mathbf{130_1}$, $\mathbf{130_2}$, and $\mathbf{130_3}$ acts to inhibit dielectric degradation in the presence of contaminants. In another embodiment, at least one of the inhibiting layers $\mathbf{130_0}$, $\mathbf{130_1}$, $\mathbf{130_2}$, and $\mathbf{130_3}$ acts to inhibit dispersion of permittivity, decreases in permittivity, leaking of charges, and decreases in the dielectric lifetime. In another embodiment, at least one of the inhibiting layers $\mathbf{130_0}$, $\mathbf{130_1}$, $\mathbf{130_2}$, and $\mathbf{130_3}$ acts to inhibit a formation of a compound that includes a hydroxide. In another embodiment, at least one of the inhibiting layers $\mathbf{130_0}$, $\mathbf{130_1}$, $\mathbf{130_2}$, and $\mathbf{130_3}$ acts to inhibit formation of a complex hydroxide.

In one embodiment, the inhibiting layer comprises a non-conductive substance, a non-conductive compound, a conductive substance, or a conductive compound. In one embodiment, the non-conductive compound includes a nitride compound, an oxynitride compound, and an oxide compound. In another embodiment, the nitride compound is selected from a group consisting of tungsten nitride and titanium nitride. In another embodiment, the nitride compound includes a compound with a molecular formula of $Si_xN_y$. In another embodiment, the oxynitride compound includes a molecular formula of $SiO_xN_y$. The variables x and y are indicative of the desired number of atoms. In another embodiment, the oxide compound includes an aluminum oxide compound with a molecular formula of $Al_2O_3$. In another embodiment, the conductive compound includes strontium ruthenium trioxide $(SrRu)O_3$. In another embodiment, at least one of the inhibiting layers $\mathbf{130_0}$, $\mathbf{130_1}$, $\mathbf{130_2}$, and $\mathbf{130_3}$ is adjoiningly coupled to the electrode 124, the dielectric 126, and the electrode 128.

In one embodiment, at least one of the electrodes 124 and 128 comprises a substance that is selected from a group consisting of a metal, a metal alloy, and a conductive metal oxide. In various embodiments, at least one of the electrodes 124 and 128 comprises a substance or a compound that is selected from a group consisting of TiN, TiON, $WN_x$, TaN, Ta, Pt, Pt—Rh, Pt—$RhO_x$, Ru, $RuO_x$, Ir, $IrO_x$, Pt—Ru, Pt—$RuO_x$, Pt—Ir, Pt—$IrO_x$, $SrRuO_3$, Au, Pd, Al, Mo, Ag, and Poly-Si.

Figure 2:
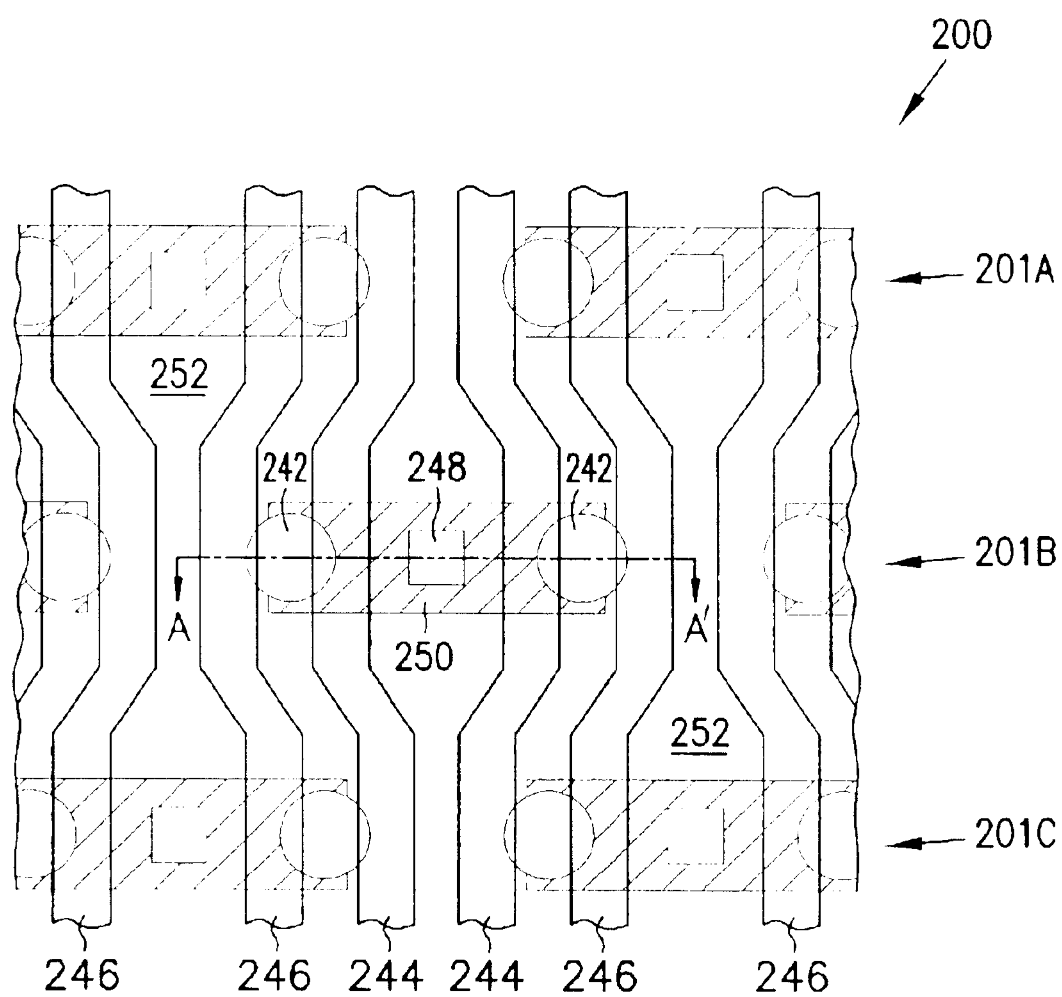
FIG. 2 is an elevation view of a semiconductor memory array according to one embodiment of the present invention.

FIG. 2 is an elevation view of a semiconductor memory array according to one embodiment of the present invention. The memory array 200 includes memory cell regions 242 formed overlying active areas 250. Active areas 250 are separated by field isolation regions 252. Active areas 250 and field isolation regions 252 are formed overlying a semiconductor substrate.

The memory cell regions 242 are arrayed substantially in rows and columns. Shown in FIG. 2 are portions of three rows 201A, 201B and 201C. Separate digit lines (not shown) would be formed overlying each row 201 and coupled to active areas 250 through digit line contact regions 248. Word line regions 244 and 246 are further coupled to active areas 250, with word line regions 244 coupled to active areas 250 in row 201B and word line regions 246 coupled to active areas 250 in rows 201A and 201C. The word line regions 244 and 246, coupled to memory cells in this alternating fashion, generally define the columns of the memory array. This folded bit-line architecture is well known in the art for permitting higher densification of memory cell regions 242.

FIGS. 3A–3J are cross-sectional views of a semiconductor structure during processing according to one embodiment of the present invention. FIGS. 3A–3J are cross-sectional views taken along line A–AN of FIG. 2 during various processing stages.

Semiconductor structure 300 includes a substrate 302. The substrate 302 may be a silicon substrate, such as a p-type silicon substrate. Field isolators 304 are formed over field isolation regions 352 of the substrate 302. Field isolators 304 are generally formed of an insulator material, such as silicon oxides, silicon nitrides, or silicon oxynitrides. In this embodiment, field isolators 304 are formed of silicon dioxide such as by conventional local oxidation of silicon which creates substantially planar regions of oxide on the substrate surface. Active area 350 is an area not covered by the field isolators 304 on the substrate 302. The creation of the field isolators 304 is preceded or followed by the formation of a gate dielectric layer 314. In this embodiment, gate dielectric layer 314 is a thermally grown silicon dioxide, but other insulator materials may be used as described herein.

The creation of the field isolators 304 and gate dielectric layer 314 is followed by the formation of a conductively doped gate layer 316, silicide layer 308, and gate spacers 312. These layers and spacers are formed by methods well known in the art. The foregoing layers are patterned to form word lines in word line regions 344 and 346. A portion of these word lines is illustratively represented by gates $\mathbf{338_0}$, $\mathbf{338_1}$, $\mathbf{338_2}$, and $\mathbf{338_3}$. In one embodiment, the silicide layer 308 includes a refractory metal layer over the conductively doped gate layer 316, such as a polysilicon layer.

Source/drain regions 306 are formed on the substrate 302 such as by conductive doping of the substrate. Source/drain regions 306 have a conductivity opposite the substrate 302. For a p-type substrate, source/drain regions 306 would have an n-type conductivity. The source/drain regions 306 include lightly doped source/drain regions 310 that are formed by implanting a low-dose substance, such as an n-type or p-type material. Such lightly doped source/drain regions 310 help to reduce high field in the source/drain junctions of a small-geometry semiconductor structure, such as semiconductor structure 300. In one embodiment, each of the gates $\mathbf{338_0}$, $\mathbf{338_1}$, $\mathbf{338_2}$, and $\mathbf{338_3}$ is enclosed by a nitride compound layer. The nitride compound layer includes a molecular formula of $Si_xN_y$. The variables x and y are indicative of a desired number of atoms. The portion of the word lines that are illustratively represented by gates $\mathbf{338_0}$, $\mathbf{338_1}$, $\mathbf{338_2}$, and $\mathbf{338_3}$ is adapted to be coupled to periphery contacts (not shown). The periphery contacts are located at the end of a memory array and are adapted for electrical communication with external circuitry.

The foregoing discussion is illustrative of one example of a portion of a fabrication process to be used in conjunction with the various embodiments of the invention. Other methods of fabrication are also feasible and perhaps equally viable. For clarity purposes, many of the reference numbers are eliminated from subsequent drawings so as to focus on the portion of interest of the semiconductor structure 300.

Figure 3A:
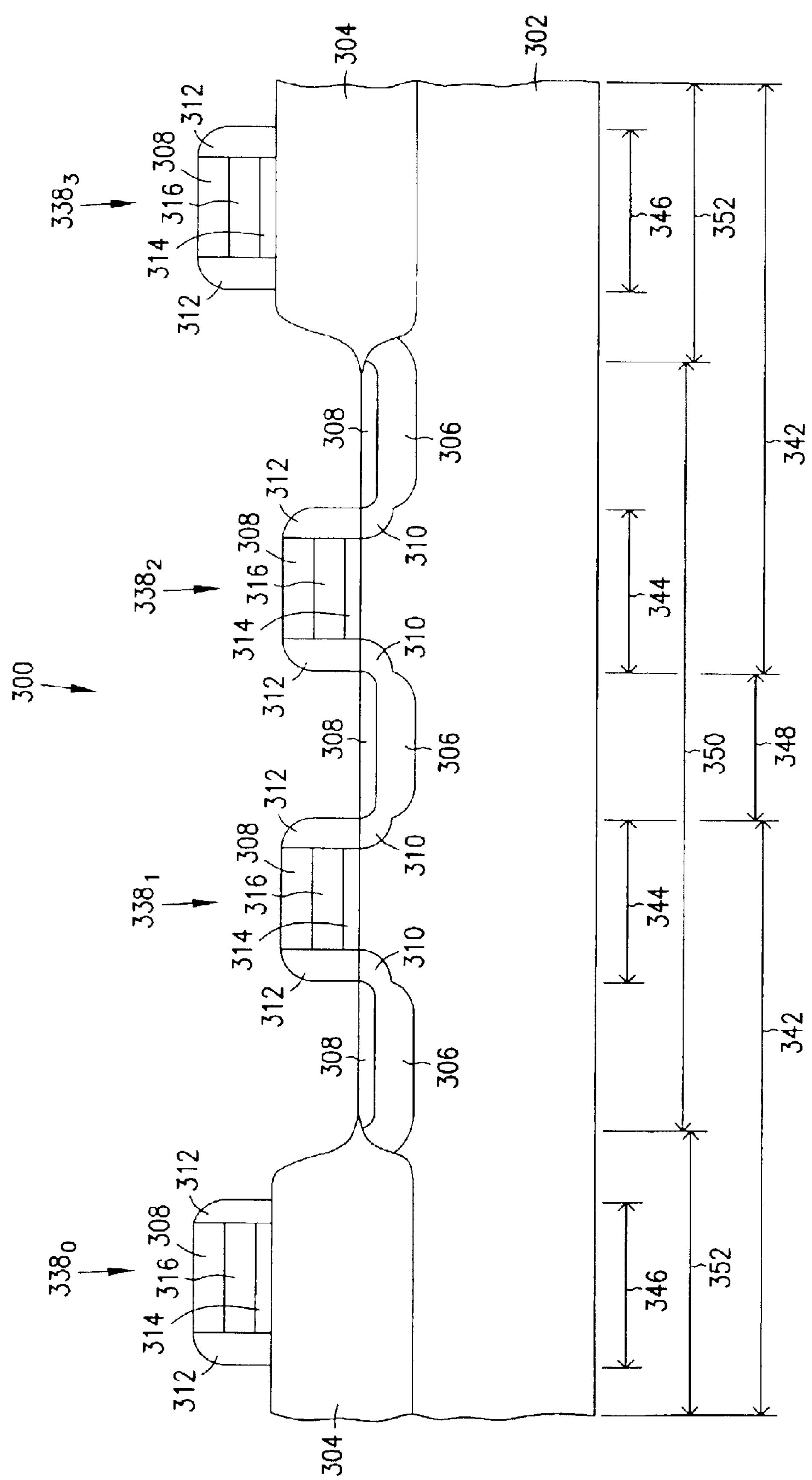
FIGS. 3A–3J are cross-sectional views of a semiconductor structure during processing according to one embodiment of the present invention.
Figure 3B:
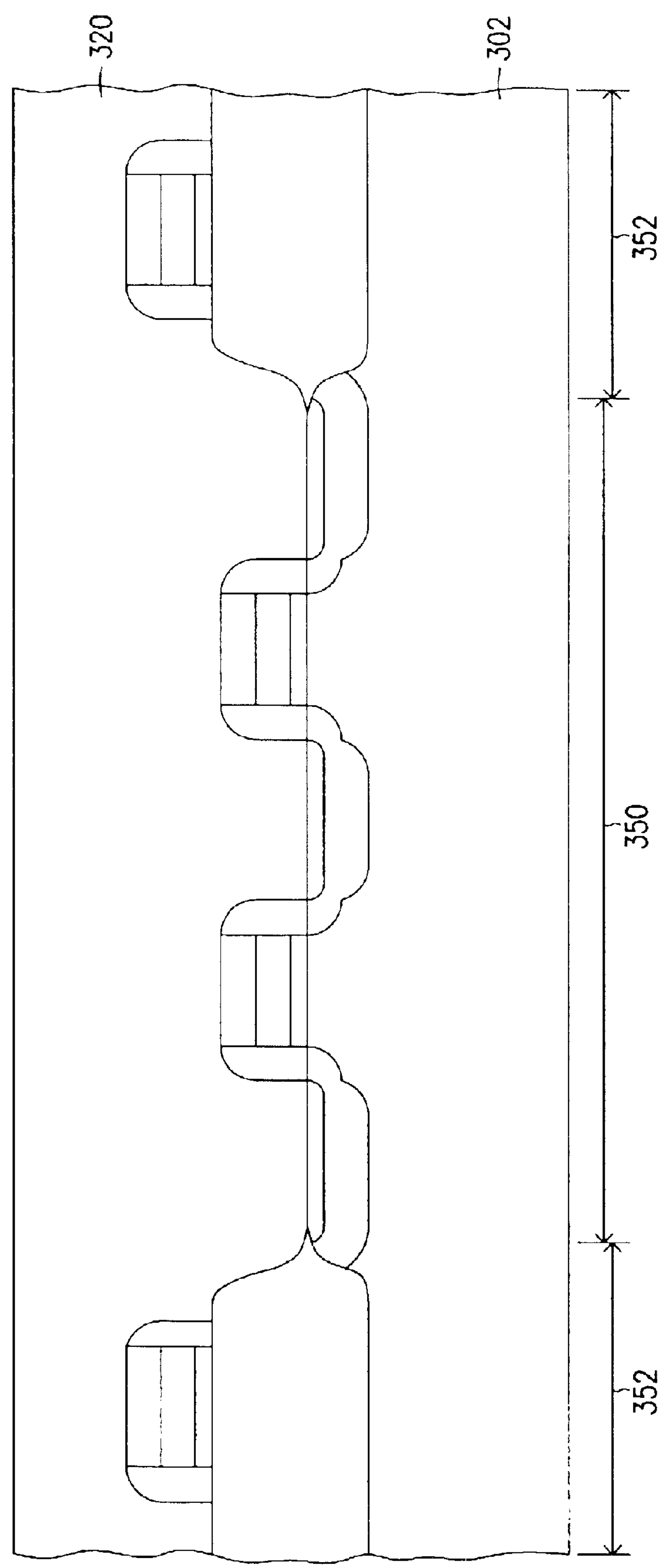

FIG. 3B shows the semiconductor structure following the next sequence of processing. A thick insulation layer 320 is deposited overlying substrate 302 as well as field isolation regions 352, and active regions 350. Insulation layer 320 is an insulator material such as silicon oxide, silicon nitride, and silicon oxynitride. In one embodiment, insulation layer 320 is a doped insulator material such as borophosphosilicate glass (BPSG), a boron and phosphorous-doped silicon oxide. The insulation layer 320 is planarized, such as by chemical-mechanical planarization (CMP), in order to provide a uniform height.

Figure 3C:
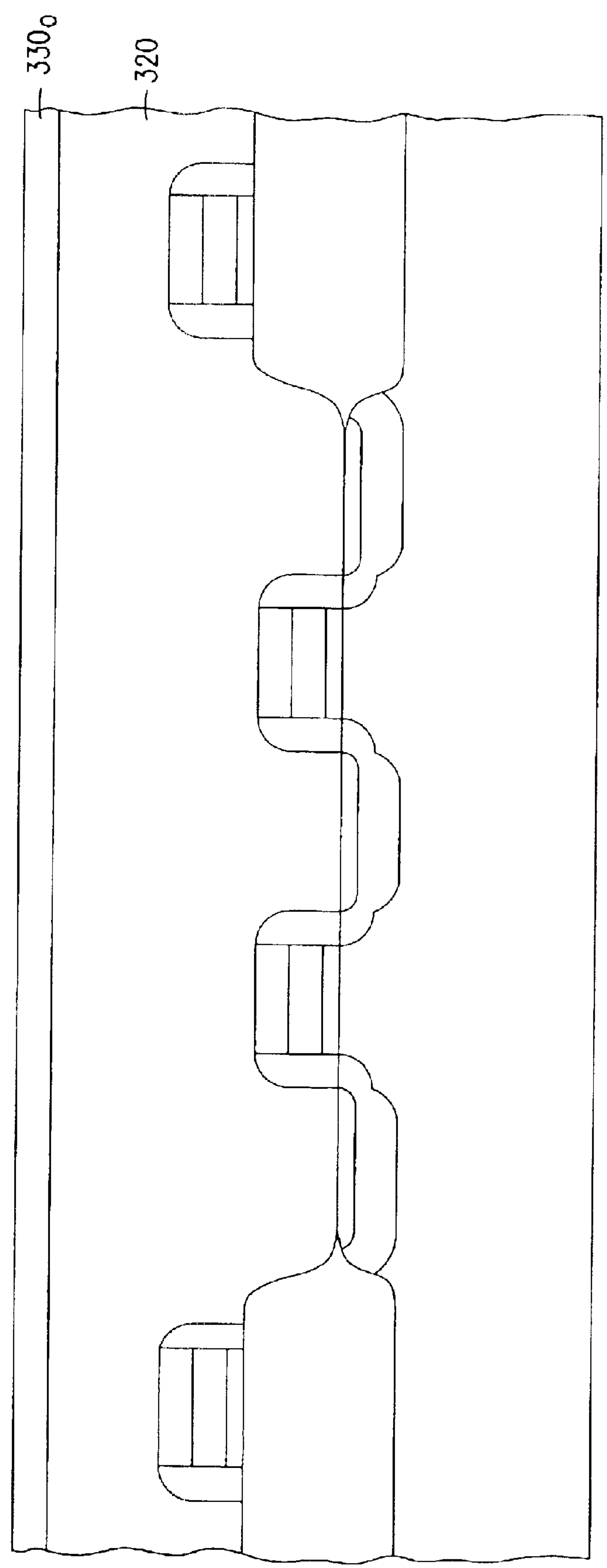

FIG. 3C shows the semiconductor structure following the next sequence of processing. The first inhibiting layer $\mathbf{330}_0$ is formed on or abutting the insulation layer 320. The first inhibiting layer $\mathbf{330}_0$, includes a nitride compound. In one embodiment, the first inhibiting layer $\mathbf{330}_0$ includes a metal nitride compound. The nitride compound includes a substance with a molecular formula of $Si_xN_y$. The variables x and y are indicative of the desired number of atoms.

The first inhibiting layer $\mathbf{330}_0$ may be formed by any method, such as collimated sputtering, chemical vapor deposition (CVD), or other deposition techniques. In this embodiment, the first inhibiting layer $\mathbf{330}_0$ is patterned to form the first inhibiting layer of a semiconductor structure of interest, such as a capacitor.

Figure 3D:
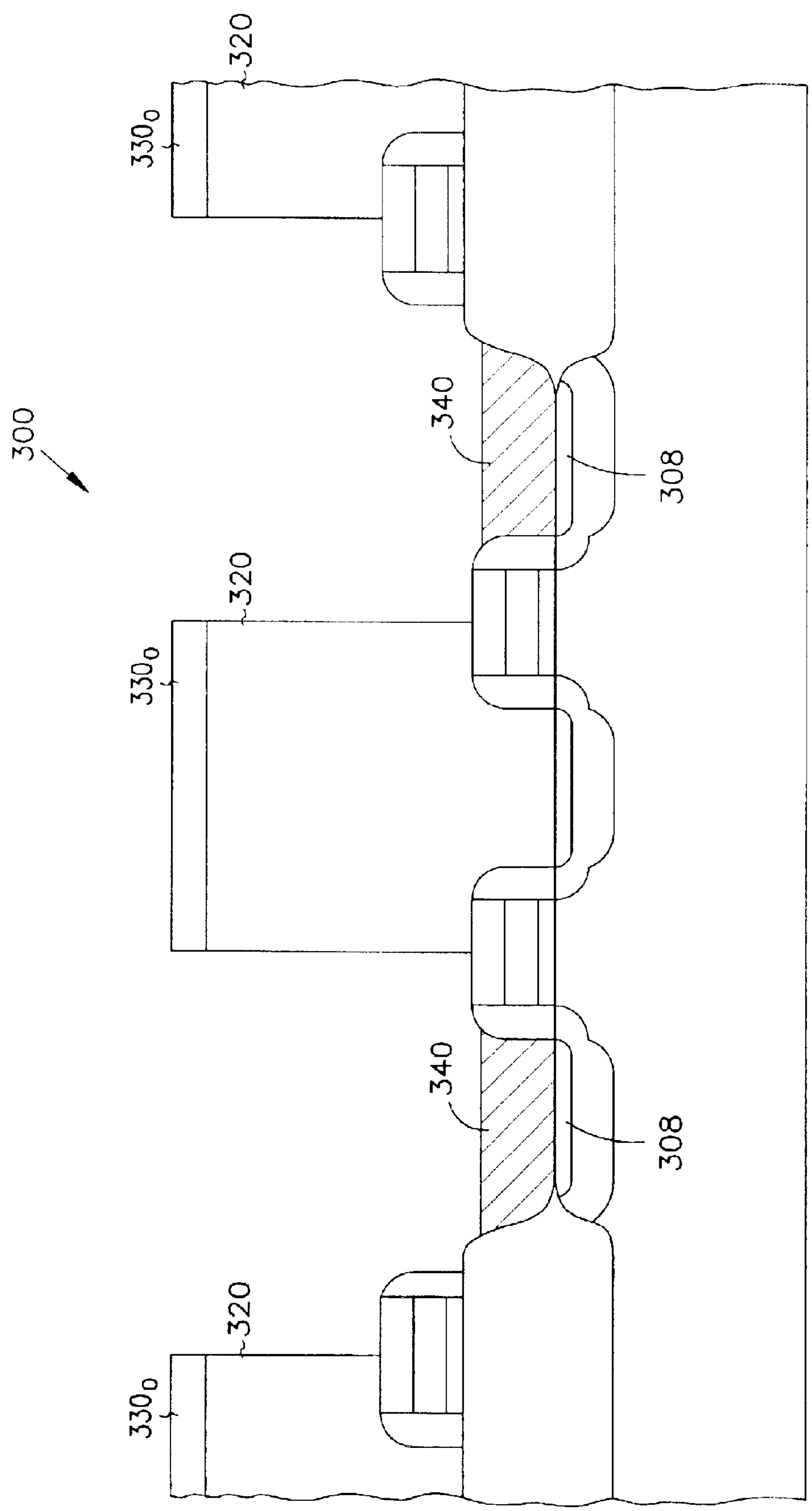

FIG. 3D shows the semiconductor structure following the next sequence of processing. The semiconductor structure 300 is patterned using photolithography with appropriately placed masks to define future locations of memory cells. Then portions of the first inhibiting layer $\mathbf{330}_0$ and the insulation layer 320 are exposed and removed along with the masks. These portions of the first inhibiting layer $\mathbf{330}_0$ and the insulation layer 320 may be removed by etching or other suitable removal techniques known in the art. Removal techniques are generally dependent on the material of construction of the layer to be removed as well as the surrounding layers to be retained. Patterning of the first inhibiting layer $\mathbf{330}_0$ and the insulation layer 320 creates openings having bottom portions exposed to portions of the silicide region 308 and sidewalls defined by the insulation layer 320. A metallization layer 340 is formed on the silicide region 308 using a suitable deposition technique. In one embodiment, the metallization layer 340 may be considered a conductive plug. In another embodiment, the conductive plug includes conductive polysilicon.

Figure 3E:
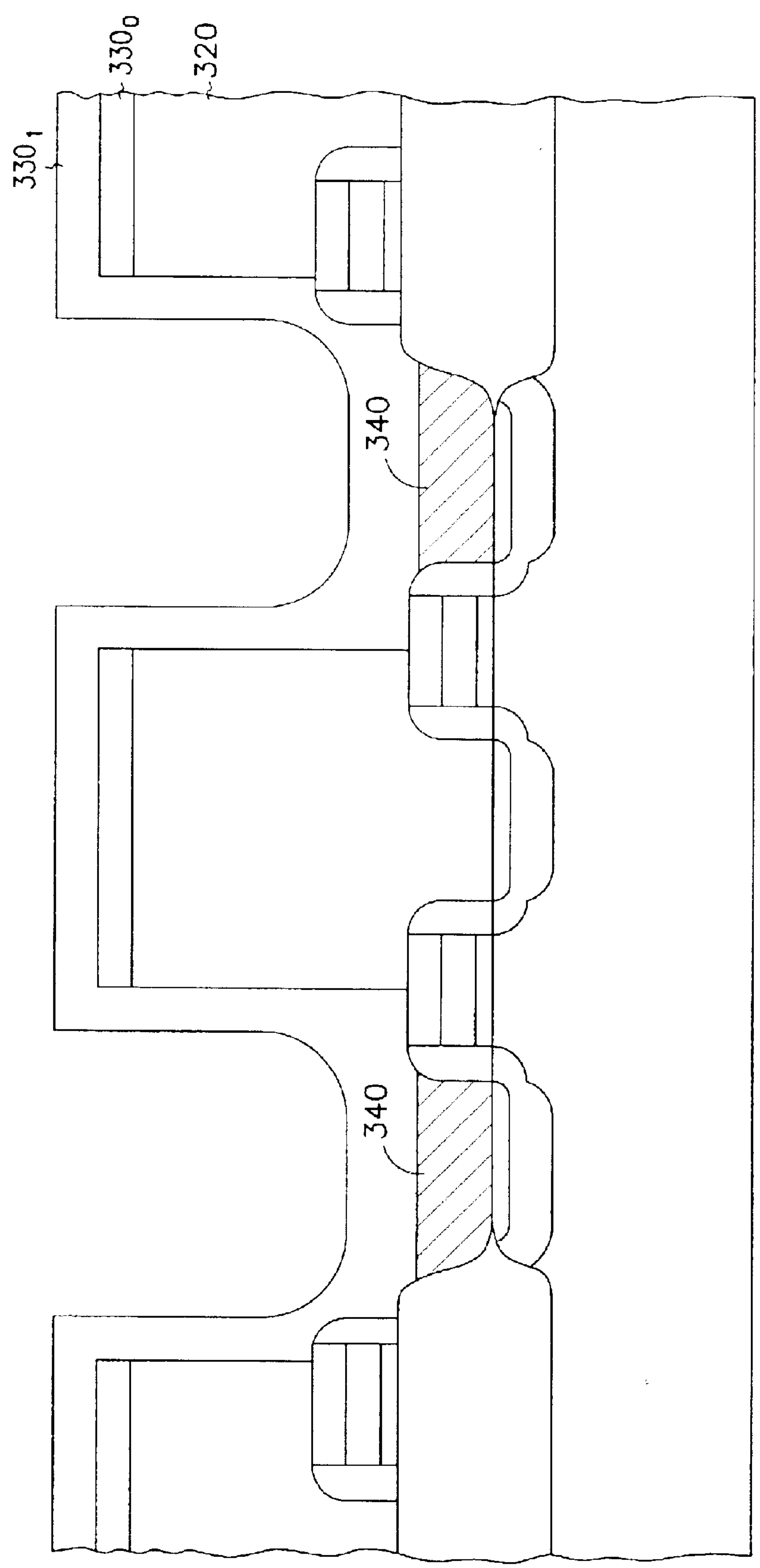

FIG. 3E shows the semiconductor structure following the next sequence of processing. A second inhibiting layer $\mathbf{330}_1$ is formed on the first inhibiting layer $\mathbf{330}_0$, the insulation layer 320 and the metallization layer 340. The second inhibiting layer $\mathbf{330}_1$ includes a nitride compound. In one embodiment, the second inhibiting layer $\mathbf{330}_1$ includes a metal nitride compound. The nitride compound includes a substance with a molecular formula of $Si_xN_y$. The variables x and y are indicative of the desired number of atoms. The second inhibiting layer $\mathbf{330}_1$ may be formed by any method, such as collimated sputtering, chemical vapor deposition (CVD), or other deposition techniques.

Figure 3F:
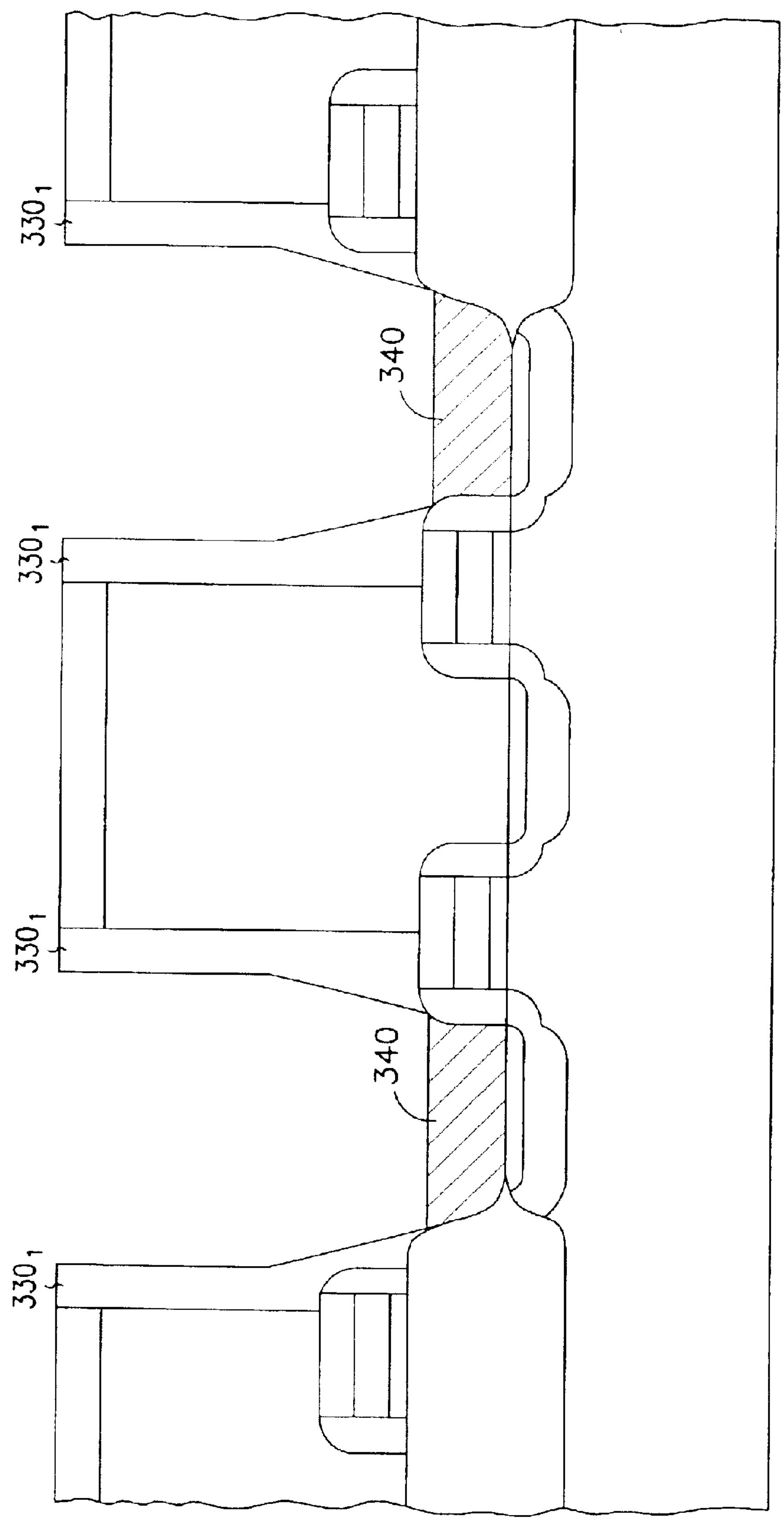

FIG. 3F shows the semiconductor structure following the next sequence of processing. In one embodiment, the second inhibiting layer $\mathbf{330}_1$ is etched to define a chamber with an aperture that adjoins the metallization layer 340 and two sidewalls extending outwardly from the aperture. In one embodiment, the etching technique is selected from a group consisting of a spacer etching technique and an etch-back technique.

In the various embodiments, the two sidewalls extend outwardly from the aperture and longitudinally from a predetermined distal terminal or edge. In another embodiment, the second inhibiting layer $\mathbf{330}_1$ defines a cylindrical chamber with a convex surface that adjoins the metallization layer 340 and two sidewalls extending outwardly from the convex surface. In another embodiment, the second inhibiting layer $\mathbf{330}_1$ defines an exposed surface and at least two sidewalls that extend from the surface.

Figure 3G:
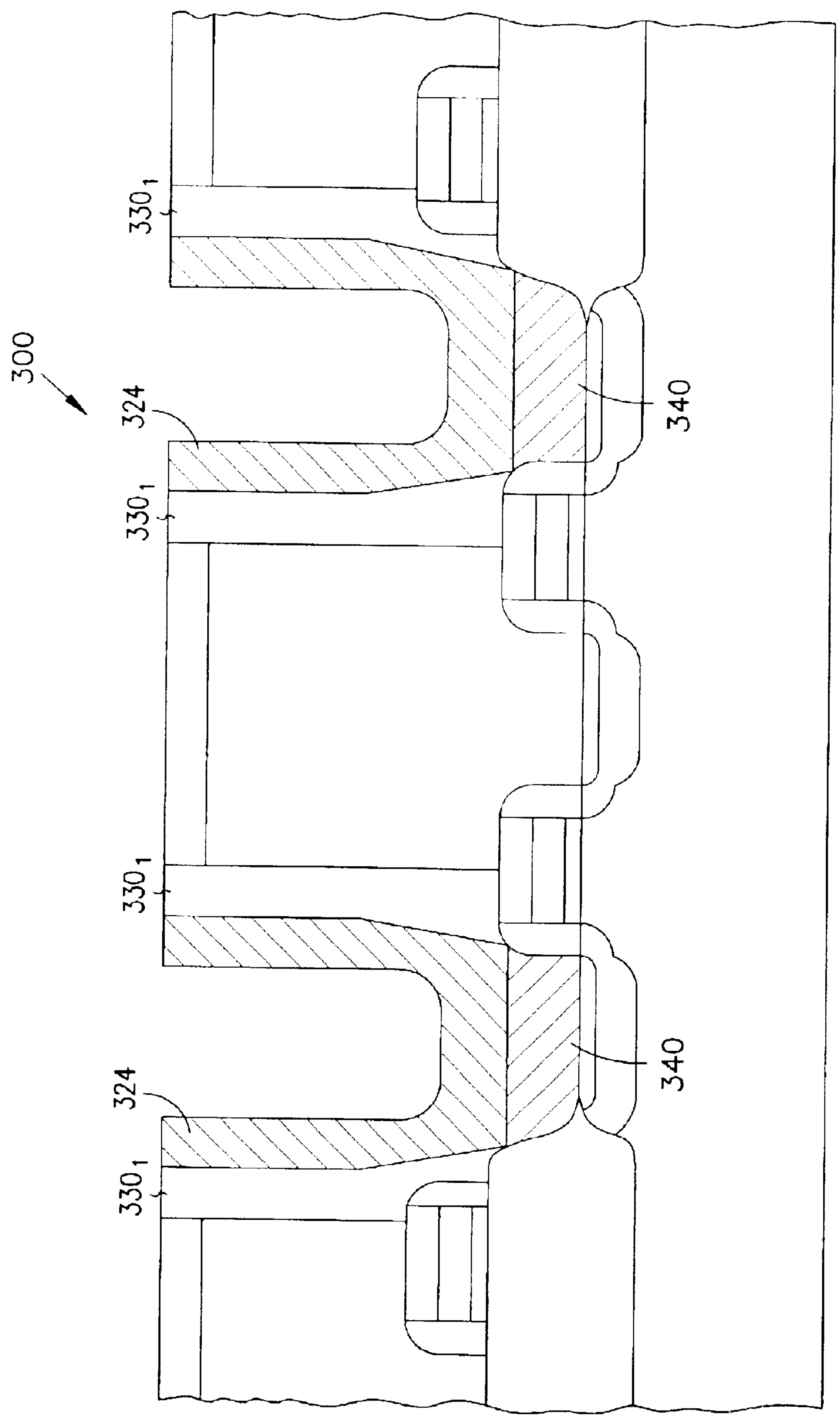

FIG. 3G shows the semiconductor structure following the next sequence of processing. A conductive layer 324 is formed on or adjoining the inhibiting layer $\mathbf{330}_0$, the insulation layer 320 and the metallization layer 340. The conductive layer 324 includes a conductive material. In one embodiment, the conductive layer 324 is selected from a group consisting of a metal, a metal alloy, and a conductive metal oxide. In another embodiment, the conductive layer 324 includes a metal that is selected from a group consisting of a refractory metal and a noble metal. The conductive layer 324 may be formed by any method, such as collimated sputtering, chemical vapor deposition (CVD), or other deposition techniques. In this embodiment, the conductive layer 324 forms the bottom conductive layer, or bottom electrode, or bottom plate of a semiconductor structure of interest, such as a capacitor.

After the formation of the conductive layer 324, in one embodiment, the conductive layer 324 undergoes a localizing or a polishing process such as by chemical mechanical planarization technique or other suitable techniques. Such localizing technique disposes the conductive layer 324 to adjoin the metallization layer 340. In another embodiment, the conductive layer 324 undergoes an etching process such as by a wet etch technique or a dry etch technique. The result is as shown in FIG. 3G.

Next, the semiconductor structure 300 undergoes a baking process. In one embodiment, this baking process helps to inhibit contaminants from existing within the vicinity of the semiconductor structure 300. In another embodiment, the baking process helps to inhibit formation of a compound, such as a hydroxide compound, so as to inhibit dielectric degradation. In one embodiment, the baking process includes an annealing process. In another embodiment, the baking process includes a recovery annealing process. In another embodiment, the baking process occurs at about 100 degrees Celsius to about 400 degrees Celsius. In another embodiment, the baking process occurs in a gaseous ambient selected from a group consisting of $N_2$, Ar, He, $O_2$, $O_3$, NO, and $N_2O$. In another embodiment, the baking process may occurs under plasma conditions.

Figure 3H:
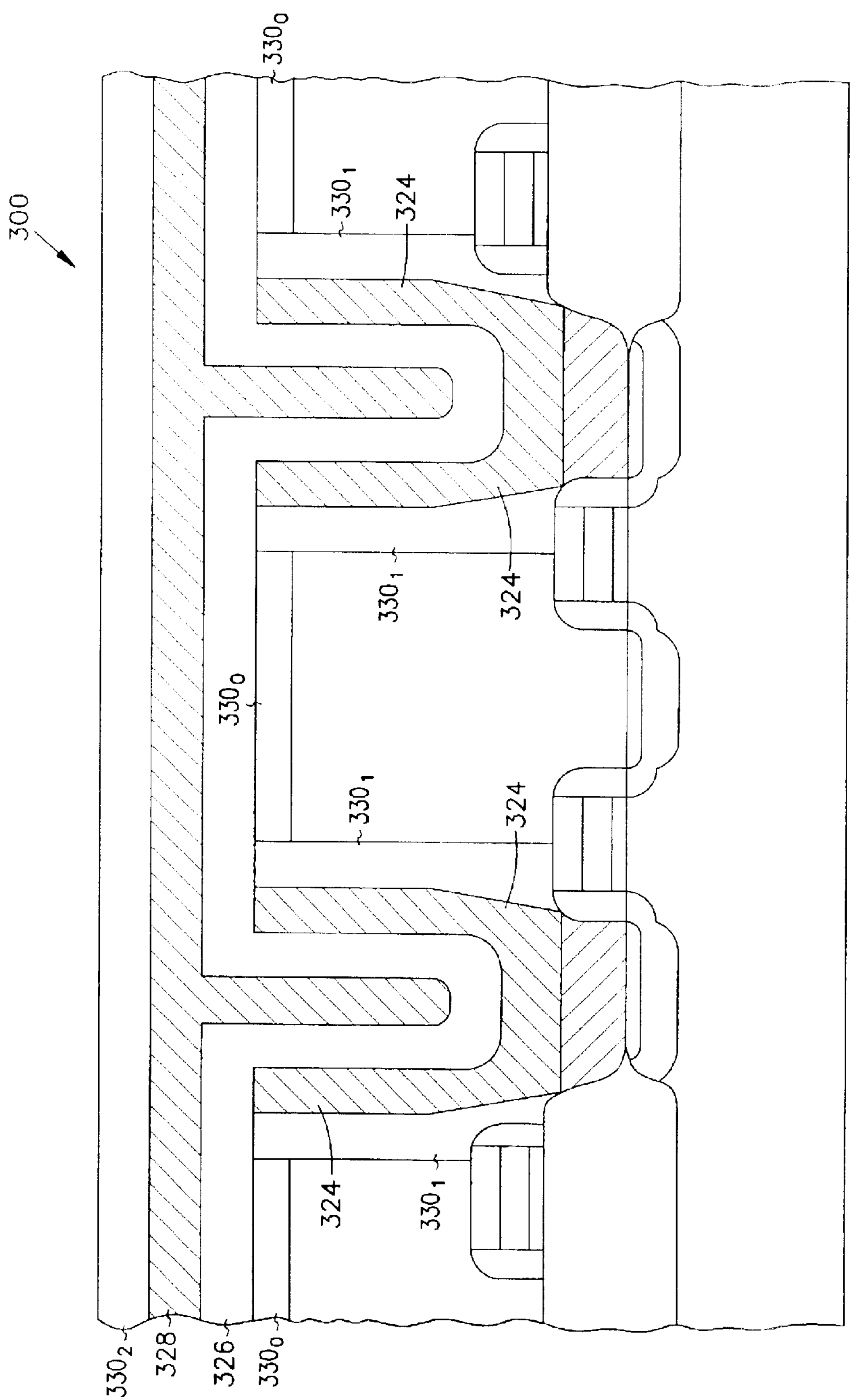

FIG. 3H shows the semiconductor structure following the next sequence of processing. A dielectric layer 326 is formed on or adjoining the first inhibiting layer $\mathbf{330}_0$, the second inhibiting layer $\mathbf{330}_1$, and the conductive layer 324. The dielectric layer 326 includes an oxide compound. In one embodiment, the dielectric layer 326 is a thin film dielectric. In one embodiment, the oxide compound includes barium strontium titanate. In another embodiment, the dielectric layer 326 includes a thin film of a high permittivity insulator material. The dielectric layer 326 may be formed by any method, such as collimated sputtering, chemical vapor deposition (CVD), or other deposition techniques.

After the dielectric layer 326 is formed, the baking process as described hereinbefore is iterated. This will help to inhibit undesired degradation in the presence of contaminants within the vicinity of the semiconductor structure 300.

A conductive layer 328 is formed on the dielectric layer 326. The conductive layer 328 includes a conductive material. In one embodiment, the conductive layer 328 is selected from a group consisting of a metal, a metal alloy, and a conductive metal oxide. In another embodiment, the conductive layer 328 includes a metal that is selected from a group consisting of a refractory metal and a noble metal. The conductive layer 328 may be formed by any method, such as collimated sputtering, chemical vapor deposition (CVD), or other deposition techniques. In this embodiment, the conductive layer 328 forms the top conductive layer, or top electrode, or top plate of a semiconductor structure of interest, such as a capacitor.

After the conductive layer 328 is formed, the baking process as described hereinbefore is iterated. This will help to inhibit undesired degradation in the presence of contaminants within the vicinity of the semiconductor structure 300.

A third inhibiting layer $\mathbf{330_2}$ is formed on the conductive layer 328. The third inhibiting layer $\mathbf{330_2}$ includes a nitride compound. In one embodiment, the third inhibiting layer $\mathbf{330_2}$ includes a metal nitride compound. The nitride compound includes a substance with a molecular formula of $Si_xN_y$. The variables x and y are indicative of the desired number of atoms. The third inhibiting layer $\mathbf{330_2}$ may be formed by any method, such as collimated sputtering, chemical vapor deposition (CVD), or other deposition techniques.

In one embodiment, the second inhibiting layer $\mathbf{330_1}$ and the third inhibiting layer $\mathbf{330_2}$ defines an enclosure that partially encloses the capacitor. In one embodiment, the second inhibiting layer $\mathbf{330_1}$ and the third inhibiting layer $\mathbf{330_2}$ defines a passivation to inhibit formation of a hydroxide compound near the capacitor.

Figure 3I:
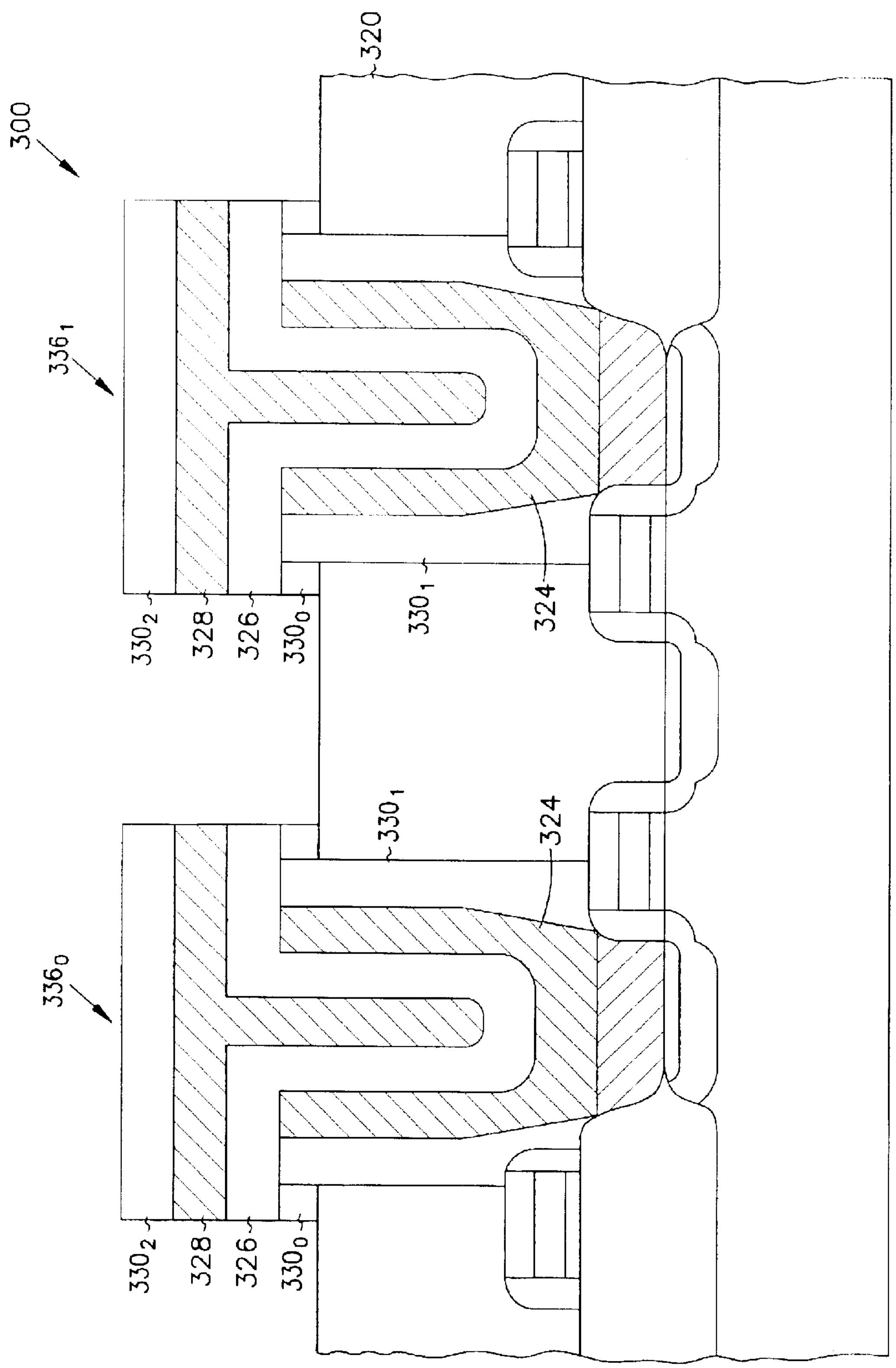

FIG. 3I shows the semiconductor structure following the next sequence of processing. The semiconductor structure 300 is patterned using photolithography with appropriately placed masks to define a number of capacitors to be used in memory cells. Then portions of the first inhibiting layer $\mathbf{330_0}$, the dielectric layer 326, the conductive layer 328, and the second inhibiting layer $\mathbf{330_2}$ are exposed and removed along with the masks. Those of the first inhibiting layer $\mathbf{330_0}$, the dielectric layer 326, the conductive layer 328, and the second inhibiting layer $\mathbf{330_2}$ may be removed by etching or other suitable removal techniques known in the art. Removal techniques are generally dependent on the material of construction of the layer to be removed as well as the surrounding layers to be retained. Patterning of the first inhibiting layer $\mathbf{330_0}$, the dielectric layer 326, the conductive layer 328, and the second inhibiting layer $\mathbf{330_2}$ defines two edges or terminals for each capacitor $\mathbf{336_0}$ and $\mathbf{336_1}$. These edges are the result of etching the various portions of the semiconductor structure 300 down to the insulation layer 320.

Figure 3J:
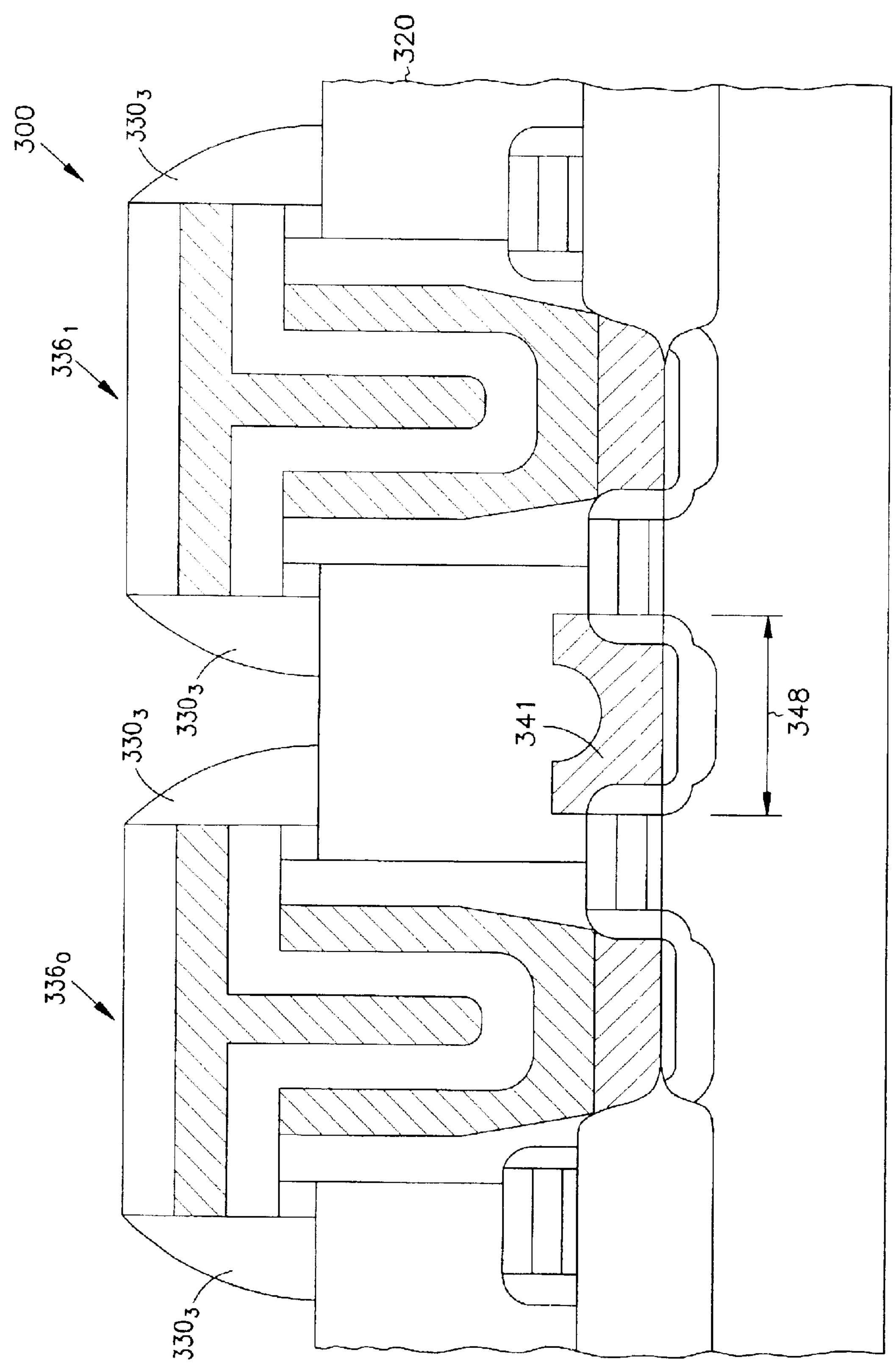

FIG. 3J shows the semiconductor structure following the next sequence of processing. A fourth inhibiting layer $\mathbf{330_3}$ is formed on the insulator layer 320 and the capacitors $\mathbf{336_0}$ and $\mathbf{336_1}$. The fourth inhibiting layer 3303 includes a nitride compound. In one embodiment, the fourth inhibiting layer $\mathbf{330_3}$ includes a metal nitride compound. The nitride compound includes a substance with a molecular formula of $Si_xN_y$. The variables x and y are indicative of the desired number of atoms. The fourth inhibiting layer $\mathbf{330_3}$ may be formed by any method, such as collimated sputtering, chemical vapor deposition (CVD), or other deposition techniques. Once the fourth inhibiting layer $\mathbf{330_3}$ is formed, a portion of the fourth inhibiting layer $\mathbf{330_3}$ is removed using a suitable technique, such as reactive ion etching. Such etching defines sidewall spacers as shown in FIG. 3J.

In one embodiment, the inhibiting layers $\mathbf{330_0}$, $\mathbf{330_1}$, $\mathbf{330_2}$, and $\mathbf{330_3}$ define an enclosure that encloses the capacitors $\mathbf{336_0}$ and $\mathbf{336_1}$. In another embodiment, the inhibiting layers $\mathbf{330_0}$, $\mathbf{330_1}$, $\mathbf{330_2}$, and $\mathbf{330_3}$ define a passivation against dielectric degradation in the presence of contaminants for the capacitors $\mathbf{336_0}$ and $\mathbf{336_1}$. In another embodiment, the inhibiting layers $\mathbf{330_0}$, $\mathbf{330_1}$, $\mathbf{330_2}$, and $\mathbf{330_3}$ define a hermetic barrier around the capacitors $\mathbf{336_0}$ and $\mathbf{336_1}$ to inhibit dielectric degradation in the presence of contaminants. The term "hermetic" means the inclusion of a barrier to resist a disturbance in the physical or chemical forces.

A digit line contact 341 is formed over the digit line contact regions 348. The formation of the digit line contact 341 and the completion of the semiconductor structure 300 do not limit the embodiments of the present invention and as such will not be discussed here in detail.

Figure 4:
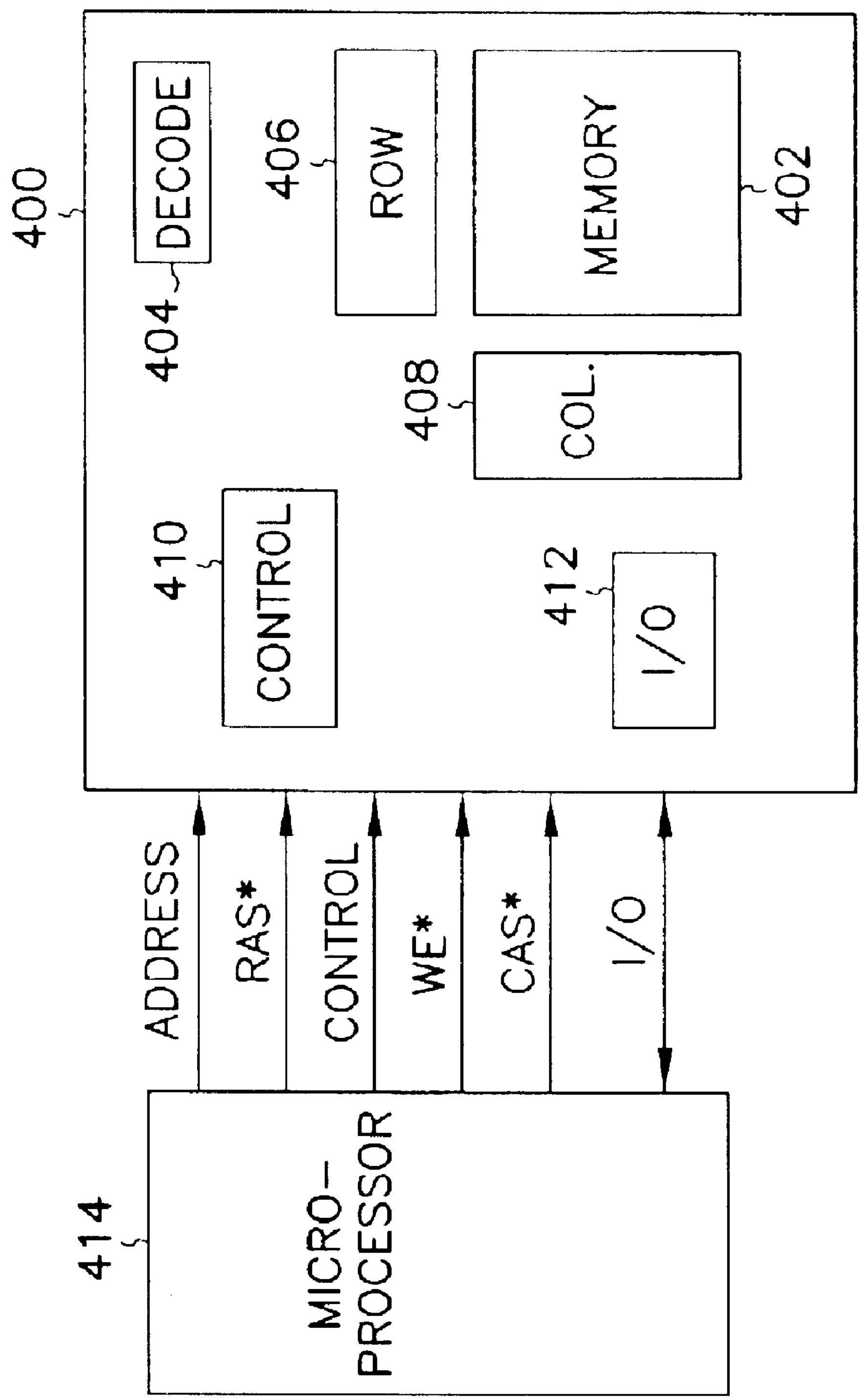
FIG. 4 is a block diagram of a device according to one embodiment of the present invention.

FIG. 4 is a block diagram of a device according to one embodiment of the present invention. The memory device 400 includes an array of memory cells 402, address decoder 404, row access circuitry 406, column access circuitry 408, control circuitry 410, and input/output circuit 412. The memory device 400 can be coupled to an external microprocessor 414, or memory controller for memory accessing. The memory device 400 receives control signals from the processor 414, such as WE*, RAS* and CAS* signals. The memory device 400 is used to store data which is accessed via I/O lines. It will be appreciated by those skilled in the art that additional circuitry and control signals can be provided, and that the memory device 400 has been simplified to help focus on the invention. At least one of the memory cells has an inhibiting layer in accordance with the aforementioned embodiments.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Figure 5:
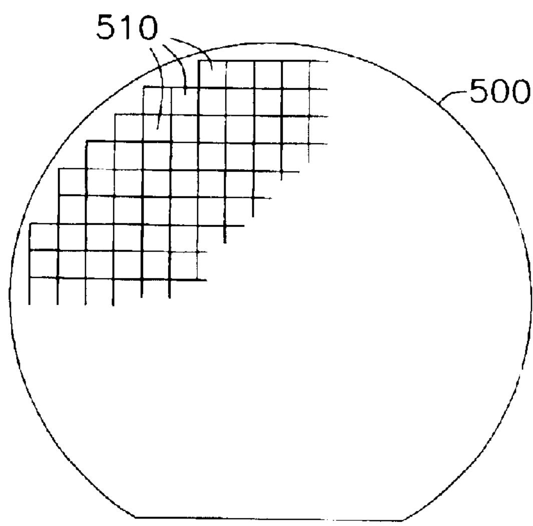
FIG. 5 is an elevation view of a semiconductor wafer according to one embodiment of the present invention.

FIG. 5 is an elevation view of a semiconductor wafer according to one embodiment of the present invention. In one embodiment, a semiconductor die 510 is produced from a wafer 500. A die is an individual pattern, typically rectangular, on a substrate that contains circuitry, or integrated circuit devices, to perform a specific function. At least one of the integrated circuit devices includes a memory cell that has an inhibiting layer as discussed in the various embodiments heretofore in accordance with the invention. A semiconductor wafer will typically contain a repeated pattern of such dies containing the same functionality. Die 510 may contain circuitry for the inventive memory device, as discussed above. Die 510 may further contain additional circuitry to extend to such complex devices as a monolithic processor with multiple functionality. Die 510 is typically packaged in a protective casing (not shown) with leads extending therefrom (not shown) providing access to the circuitry of the die for unilateral or bilateral communication and control.

Figure 6:
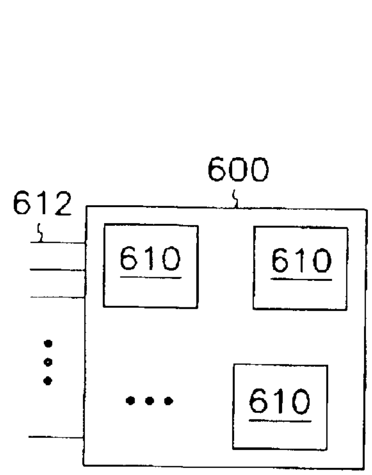
FIG. 6 is a block diagram of a circuit module according to one embodiment of the present invention.

FIG. 6 is a block diagram of a circuit module according to one embodiment of the present invention. Two or more dies 610 may be combined, with or without protective casing, into a circuit module 600 to enhance or extend the functionality of an individual die 610. Circuit module 600 may be a combination of dies 610 representing a variety of functions, or a combination of dies 610 containing the same functionality. One or more dies 610 of circuit module 600 contain at least one inhibiting layer in accordance with the embodiments of the present invention.

Some examples of a circuit module include memory modules, device drivers, power modules, communication modems, processor modules, and application-specific modules, and may include multilayer, multichip modules. Circuit module 600 may be a subcomponent of a variety of electronic systems, such as a clock, a television, a cell phone, a personal computer, an automobile, an industrial control system, an aircraft, and others. Circuit module 600 will have a variety of leads 612 extending therefrom and coupled to the dies 610 providing unilateral or bilateral communication and control.

Figure 7:
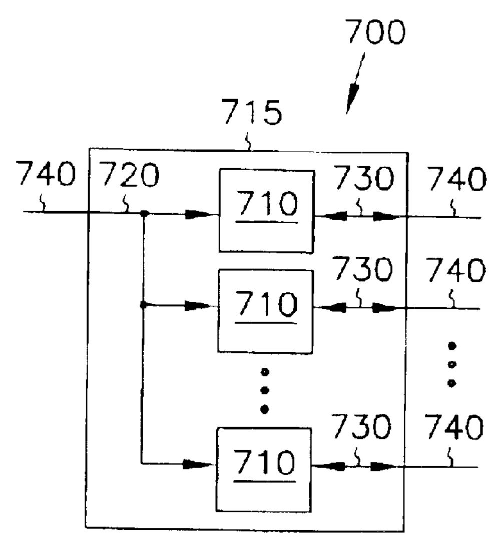
FIG. 7 is a block diagram of a memory module according to one embodiment of the present invention.

FIG. 7 is a block diagram of a memory module according to one embodiment of the present invention. Memory module 700 contains multiple memory devices 710 contained on support 715, the number depending upon the desired bus width and the desire for parity. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions as shown. At least one of the memory devices 710 includes a memory cell that includes an inhibiting layer as discussed in various embodiments in accordance with the invention.

Figure 8:
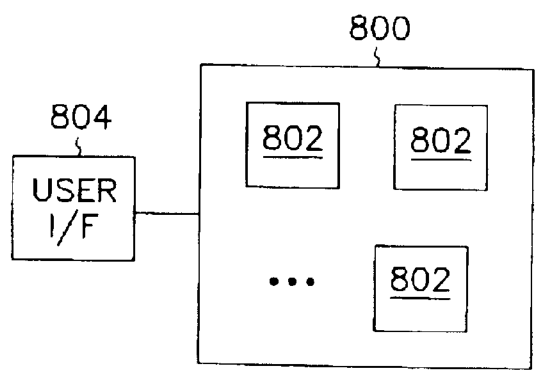
FIG. 8 is a block diagram of a system according to one embodiment of the present invention.

FIG. 8 is a block diagram of a system according to one embodiment of the present invention. Electronic system 800 contains one or more circuit modules 802. Electronic system 800 generally contains a user interface 804. User interface 804 provides a user of the electronic system 800 with some form of control or observation of the results of the electronic system 800. Some examples of user interface 804 include the keyboard, pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 804 may further describe access ports provided to electronic system 800. Access ports are used to connect an electronic system to the more tangible user interface components previously exemplified. One or more of the circuit modules 802 may be a processor providing some form of manipulation, control, or direction of inputs from or outputs to user interface 804, or of other information either preprogrammed into, or otherwise provided to, electronic system 800. As will be apparent from the lists of examples previously given, electronic system 800 will often contain certain mechanical components (not shown) in addition to circuit modules 802 and user interface 804. It will be appreciated that the one or more circuit modules 802 in electronic system 800 can be replaced by a single integrated circuit. Furthermore, electronic system 800 may be a subcomponent of a larger electronic system. At least one of the circuit modules 802 includes a memory cell that includes an inhibiting layer as discussed in various embodiments in accordance with the invention.

Figure 9:
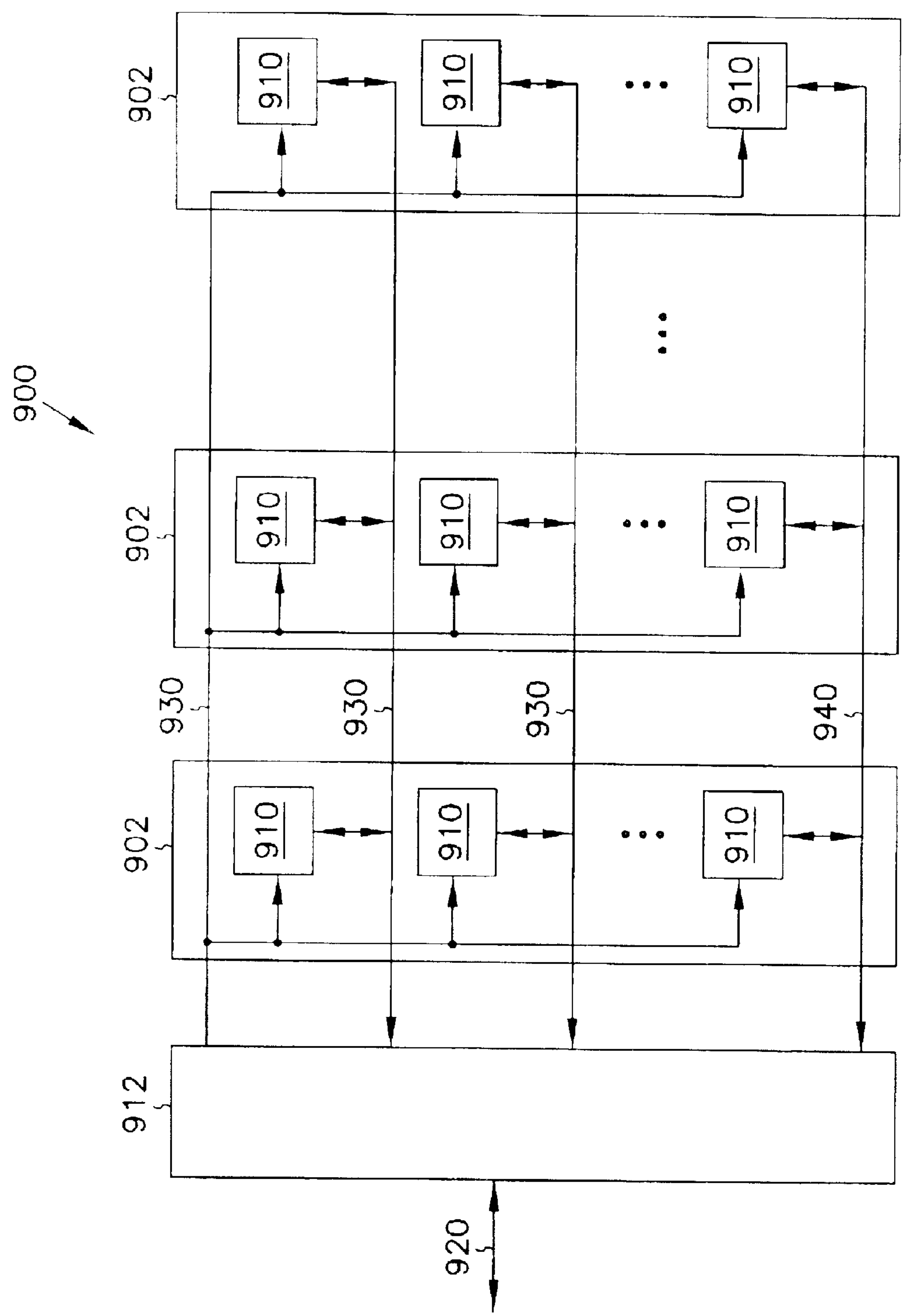
FIG. 9 is a block diagram of a system according to one embodiment of the present invention.

FIG. 9 is a block diagram of a system according to one embodiment of the present invention. Memory system 900 contains one or more memory modules 902 and a memory controller 912. Each memory module 902 includes at least one memory device 910. Memory controller 912 provides and controls a bidirectional interface between memory system 900 and an external system bus 920. Memory system 900 accepts a command signal from the external bus 920 and relays it to the one or more memory modules 902 on a command link 930. Memory system 900 provides for data input and data output between the one or more memory modules 902 and external system bus 920 on data links 940. At least one of the memory devices 910 includes a memory cell that includes an inhibiting layer as discussed in various embodiments in accordance with the invention.

Figure 10:
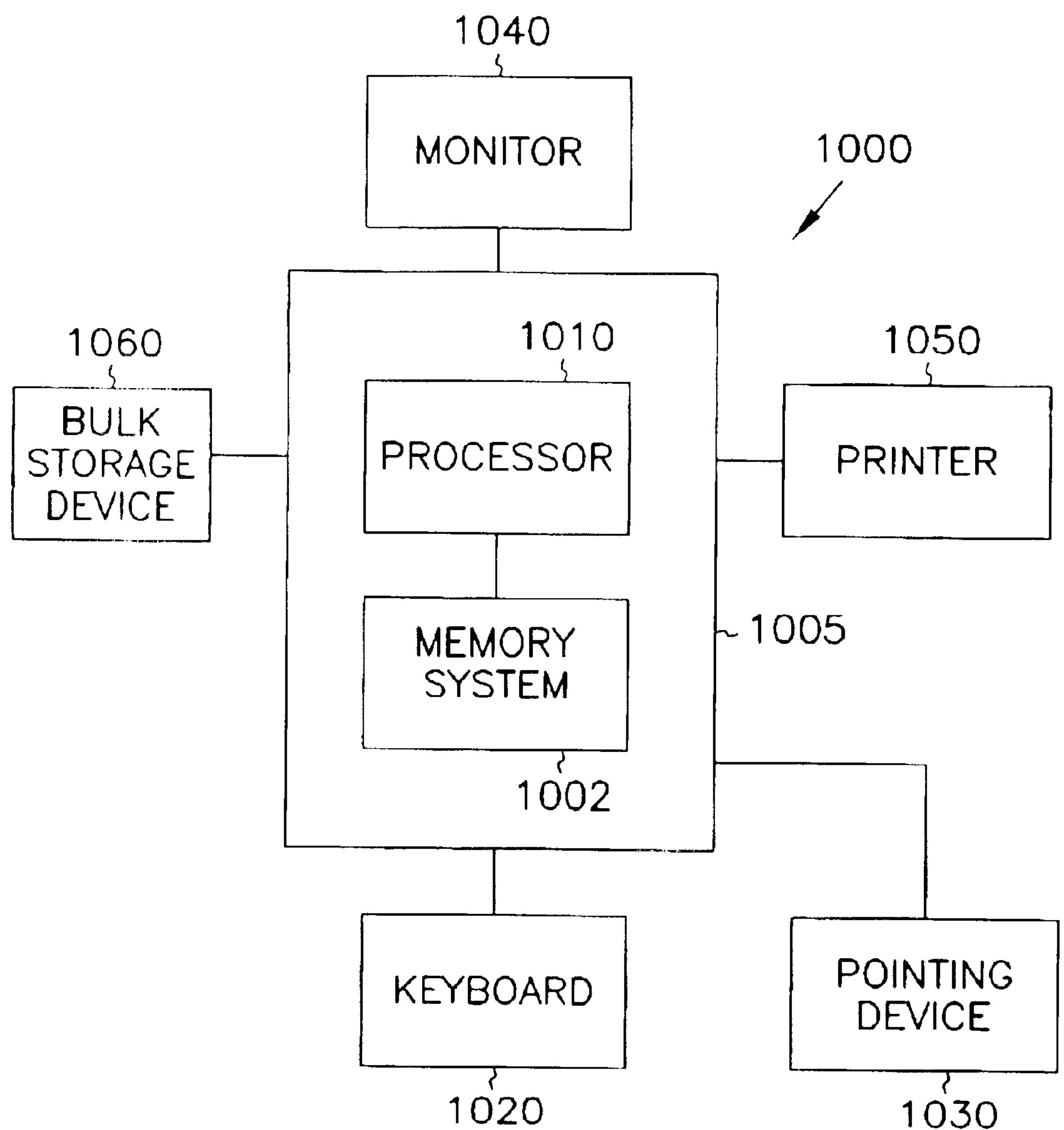
FIG. 10 is a block diagram of a system according to one embodiment of the present invention.

FIG. 10 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 may include a memory cell that includes an inhibiting layer as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit.

CONCLUSION

Systems, devices, structures, and methods have been described to address situations where contaminants undesirably acts against a high permittivity dielectric in a capacitor such that degradation occurs for the various properties of the dielectric. Capacitors that use the inhibiting layer as described heretofore benefit from the dual ability of having an increase in storage capability yet maintain reliability in the presence of contaminants. As described heretofore, the inhibiting layer inhibits formation of a compound that may degrade the dielectric. However, the inhibiting layer may also inhibit dielectric degradation that may be caused by other compounds that may form from other parts of the semiconductor structure.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A method of enhancing a semiconductor structure so as to inhibit dielectric degradation, the method comprising:

forming at least one inhibiting layer to define a chamber having an aperture and at least two sidewalls that extend outwardly from the aperture, wherein the at least one inhibiting layer includes a nitride compound;

forming a first conductive layer on the at least one inhibiting layer such that the aperture of the chamber of the at least one inhibiting layer exposes a portion of the first conductive layer;

annealing the semiconductor structure, wherein annealing includes annealing in a temperature of about greater than or about equal to 100 degrees Celsius, and wherein annealing includes annealing in a gaseous ambient selected from a group consisting of $N_2$, Ar, He, $O_2$, $O_3$, NO, and $N_2O$; and forming a dielectric layer on the first conductive layer, wherein the dielectric layer includes an oxide compound;

forming a second conductive layer on the dielectric layer; and wherein the forming of at least one inhibiting layer includes forming a first, a second, a third, and a fourth inhibiting layers, wherein the forming of the third inhibiting layer includes etching the first inhibiting layer, the dielectric layer, the second conductive layer, and the third inhibiting layer to form two edges, and wherein the forming of the at least one inhibiting layer includes etching the fourth inhibiting layer so as to form a first spacer abutting one of the two edges and a second spacer abutting the other of the two edges.

2. The method of claim 1, wherein forming at least one inhibiting layer includes forming with a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms.

3. The method of claim 1, wherein forming at least one inhibiting layer includes forming a convex surface, wherein a portion of the convex surface includes the aperture.

4. The method of claim 1, wherein annealing acts to inhibit a formation of a hydroxide compound within the vicinity of the semiconductor structure.

5. The method of claim 1, wherein forming a dielectric layer includes forming with an oxide compound, wherein the oxide compound includes barium strontium titanate.

6. A method of enhancing a semiconductor structure so as to inhibit dielectric degradation, the method comprising:

forming at least one inhibiting layer to define a chamber having an aperture and at least two sidewalls that extend outwardly from the aperture, wherein the at least one inhibiting layer includes a nitride compound;

forming a first conductive layer on the at least one inhibiting layer such that the aperture of the chamber of the at least one inhibiting layer exposes a portion of the first conductive layer;

annealing the semiconductor structure, wherein annealing includes annealing in a temperature of about greater than or about equal to 100 degrees Celsius, and wherein annealing includes annealing in a gaseous ambient selected from a group consisting of $N_2$, Ar, He, $O_2$, $O_3$, NO, and $N_2O$;

forming a dielectric layer on the first conductive layer, wherein the dielectric layer includes an oxide compound, wherein the oxide compound includes barium strontium titanate; and iterating the act of annealing;

forming a second conductive layer on the dielectric layer; and wherein the forming of at least one inhibiting layer includes forming a first, a second, a third, and a fourth inhibiting layers, wherein the forming of the third inhibiting layer includes etching the first inhibiting layer, the dielectric layer, the second conductive layer, and the third inhibiting layer to form two edges, and wherein the forming of the at least one inhibiting layer includes etching the fourth inhibiting layer so as to form a first spacer abutting one of the two edges and a second spacer abutting the other of the two edges.

7. The method of claim 6, wherein forming at least one inhibiting layer includes forming to define a cylindrical chamber.

8. The method of claim 6, wherein iterating includes iterating the act of annealing once.

9. The method of claim 6, wherein the act of iterating inhibit the presence of contaminants within the vicinity of the semiconductor structure.

10. The method of claim 6, wherein forming a first conductive layer includes forming the first conductive layer such that the first conductive layer adjoins the at least one inhibiting layer.

11. The method of claim 6, wherein forming a second conductive layer includes forming the second conductive layer that adjoins the dielectric layer.

12. The method of claim 6, wherein forming at least one inhibiting layer includes forming a first and a second inhibiting layers.

13. The method of claim 12, wherein forming a first and a second inhibiting layers includes forming the first and the second inhibiting layers with a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms.

14. The method of claim 13, wherein forming a first and a second inhibiting layers includes localizing the second inhibiting layer to the chamber, wherein the act of localizing the second inhibiting layer is selected from a group consisting of a spacer etching technique and an etch-back technique.

15. A method of enhancing a semiconductor structure so as to inhibit dielectric degradation, the method comprising:

forming at least one inhibiting layer to define a chamber having an aperture and at least two sidewalls that extend outwardly from the aperture, wherein the at least one inhibiting layer includes a nitride compound, and the forming of the at least one inhibiting layer including forming first, second, third, and fourth inhibiting layers;

forming a first conductive layer on the at least one inhibiting layer such that the aperture of the chamber of the at least one inhibiting layer exposes a portion of the first conductive layer;

annealing the semiconductor structure, wherein annealing includes annealing in a temperature of about greater than or about equal to 100 degrees Celsius, and wherein annealing includes annealing in a gaseous ambient selected from a group consisting of $N_2$, Ar, He, $O_2$, $O_3$, NO, and $N_2O$;

forming a dielectric layer on the first conductive layer, wherein the dielectric layer includes an oxide compound, wherein the oxide compound includes barium strontium titanate;

iterating the act of annealing;

forming a second conductive layer on the dielectric layer;

iterating the act of annealing;

the forming of the third inhibiting layer including etching the first inhibiting layer, the dielectric layer, the second conductive layer, and the third inhibiting layer to form two edges; and wherein forming a first, a second, a third, and a fourth inhibiting layers includes forming the fourth inhibiting layer that includes etching the fourth inhibiting layer so as to form a first spacer abutting one of the two edges and a second spacer abutting the other of the two edges.

16. The method of claim 15, wherein forming a first conductive layer includes localizing the first conductive layer to the chamber, wherein the act of localizing includes chemical mechanical planarization.

17. The method of claim 15, wherein forming a first, a second, a third, and a fourth inhibiting layers includes forming the first, the second, the third, and the fourth inhibiting layers with a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms.

18. The method of claim 17, wherein forming a first, a second, a third, and a fourth inhibiting layers includes forming the third inhibiting layer on the second conductive layer.

19. The method of claim 15, wherein iterating the act of annealing includes iterating the act of annealing once after the act of etching the first inhibiting layer, the dielectric layer, the second conductive layer, and the third inhibiting layer to form two edges.

20. A method of forming a semiconductor structure, the method comprising:

forming at least one transistor, wherein forming the at least one transistor includes forming a nitride layer that is adjoiningly coupled to the at least one transistor;

forming a conductive plug, wherein the conductive plug includes polysilicon;

forming an insulator layer, wherein the insulator layer includes boron phosphorus silicate glass;

forming a first inhibiting layer on the insulator layer, wherein the first inhibiting layer includes a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms;

etching the insulator layer and the first inhibiting layer to define a cylindrical chamber having a convex surface and at least two sidewalls that extend outwardly from the convex surface;

forming a second inhibiting layer, wherein the second inhibiting layer adjoiningly disposed on the first inhibiting layer and the insulator layer, wherein the second inhibiting layer includes a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms;

localizing the second inhibiting layer to the cylindrical chamber, wherein localizing the second inhibiting layer includes forming an aperture on a portion of the convex surface of the cylindrical chamber, wherein the aperture on the portion of the convex surface of the cylindrical chamber exposes a portion of the conductive plug, and wherein the act of localizing the second inhibiting layer is selected from a group consisting of a spacer etching technique and an etch-back technique;

forming a first conductive layer adjoiningly coupled to the first inhibiting layer such that the aperture on the portion of the convex surface of the second inhibiting layer exposes a portion of the first conductive layer to the portion of the conductive plug;

localizing the first conductive layer to the cylindrical chamber, wherein the act of localizing the first conductive layer includes chemical mechanical planarization;

annealing the semiconductor structure, wherein annealing includes annealing in a temperature of about greater than or equal to 100 degrees Celsius, wherein annealing includes annealing in a gaseous ambient selected from a group consisting of $N_2$, Ar, He, $O_2$, $O_3$, NO, and $N_2O$, wherein annealing includes a recovery annealing technique;

forming a dielectric layer adjoining the first conductive layer and the first inhibiting layer, wherein the dielectric layer includes an oxide compound, wherein the oxide compound includes barium strontium titanate;

annealing the semiconductor structure, wherein annealing includes annealing in a temperature of about greater than or equal to 100 degrees Celsius, wherein annealing includes annealing in a gaseous ambient selected from a group consisting of $N_2$, Ar, He, $O_2$, $O_3$, NO, and $N_2O$, wherein annealing includes a recovery annealing technique;

forming a second conductive layer adjoining the dielectric layer;

forming a third inhibiting layer adjoining the second conductive layer, wherein the third inhibiting layer includes a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms;

etching the first inhibiting layer, the dielectric layer, the second conductive layer, and the third inhibiting layer to expose the insulator layer so as to form two edges;

annealing the semiconductor structure, wherein annealing includes annealing in a temperature of about greater than or equal to 100 degrees Celsius, wherein annealing includes annealing in a gaseous ambient selected from a group consisting of $N_2$, Ar, He, $O_2$, $O_3$, NO, and $N_2O$, wherein annealing includes a recovery annealing technique;

forming a fourth inhibiting layer on the insulator layer and the third inhibiting layer, wherein the fourth inhibiting layer includes a compound selected from a group consisting of a nitride compound, an oxynitride compound, and an oxide compound, wherein the nitride compound includes a molecular formula of $Si_xN_y$, wherein the oxynitride compound includes a molecular formula of $SiO_xN_y$, wherein the oxide compound includes $Al_2O_3$ and $(SrRu)O_3$, wherein x and y are indicative of a desired number of atoms; and etching the fourth inhibiting layer so as to form a first spacer abutting one of the two edges and a second spacer abutting the other of the two edges.

21. The method of claim 20, wherein the method does not proceed in the order presented.

22. A method of forming a semiconductor structure, the method comprising:

forming a first source/drain region and a second source/drain region separated by a body region forming a channel;

depositing a metallization layer onto the first source/drain region;

forming a insulating layer containing nitrogen, the insulating layer having an aperture exposing the metallization layer and at least two sidewalls that extend outwardly from the aperture;

forming a first conductive layer onto the metallization layer;

forming a dielectric layer onto the first conductive layer;

forming a second conductive layer onto the dielectric layer; and forming a metal nitride layer onto the second conductive layer, wherein the insulating layer and the metal nitride layer form a chamber contacting and enclosing the first conductive layer, the second conductive layer, and the dielectric except at the aperture formed by the insulating layer, the insulating layer containing nitrogen and the metal nitride selected from materials that prevent intrusion of hydrogen containing contaminants;

wherein the forming of the insulating layer includes forming first, second, third, and fourth inhibiting layers, wherein the forming of the third inhibiting layer includes etching the first inhibiting layer, the dielectric layer, the second conductive layer, and the third inhibiting layer to form two edges, and wherein the forming of the at least one inhibiting layer includes etching the fourth inhibiting layer so as to form a first spacer abutting one of the two edges and a second spacer abutting the other of the two edges to thereby define the aperture.

23. The method of claim 22, wherein forming a insulating layer containing nitrogen including forming a $Si_xN_y$ layer or a $SiO_xN_y$ layer.

24. The method of claim 22, wherein forming a metal nitride layer onto the second conductive layer includes forming a tungsten nitride layer or a titanium nitride layer.

25. The method of claim 22, wherein forming a insulating layer containing nitrogen includes etching a deposited borophosphosilicate glass layer.

26. The method of claim 22, wherein forming a dielectric layer onto the first conductive layer includes forming an oxide compound.

27. The method of claim 22, wherein forming a second conductive layer onto the dielectric layer includes forming a material selected from a group consisting of a refractory metal and a noble metal.

28. A method of forming a semiconductor structure, the method comprising:

forming a insulating layer containing nitrogen, the insulating layer having an aperture and at least two sidewalls that extend outwardly from the aperture;

forming a capacitor; and forming a metal nitride layer, wherein the insulating layer and the metal nitride layer form a chamber contacting and enclosing the capacitor except at the aperture formed by the insulating layer, the insulating layer containing nitrogen and the metal nitride selected from materials that prevent intrusion of hydrogen containing contaminants;

wherein the forming of the insulating layer includes forming first, second, third, and fourth inhibiting layers, wherein the forming of the third inhibiting layer includes etching the first inhibiting layer, the dielectric layer, the second conductive layer, and the third inhibiting layer to form two edges, and wherein the forming of the at least one inhibiting layer includes etching the fourth inhibiting layer so as to form a first spacer abutting one of the two edges and a second spacer abutting the other of the two edges to thereby define the aperture.

29. The method of claim 28, wherein forming a insulating layer containing nitrogen including forming a $Si_xN_y$ layer or a $SiO_xN_y$ layer.

30. The method of claim 28, wherein forming a metal nitride layer onto the second conductive layer includes forming a tungsten nitride layer or a titanium nitride layer.

* * * * *